US012655056B2

(12) United States Patent
Zhou et al.

(10) Patent No.: US 12,655,056 B2
(45) Date of Patent: Jun. 16, 2026

(54) TRANSPARENT STRENGTHENED GLASS CERAMIC HAVING HIGH STRESS DEPTH, PREPARATION METHOD THEREFOR AND APPLICATION THEREOF

(71) Applicant: Chongqing Aureavia Hi-tech Glass Co., Ltd., Chongqing (CN)

(72) Inventors: Jingpeng Zhou, Chongqing (CN); Yanqi Zhang, Chongqing (CN); Hao Huang, Chongqing (CN)

(73) Assignee: Chongqing Aureavia Hi-tech Glass Co., Ltd., Chongqing (CN)

( * ) Notice: Subject to any disclaimer, the term of this patent is extended or adjusted under 35 U.S.C. 154(b) by 329 days.

(21) Appl. No.: 18/555,939

(22) PCT Filed: Dec. 15, 2022

(86) PCT No.: PCT/CN2022/139283
§ 371 (c)(1),
(2) Date: Oct. 18, 2023

(87) PCT Pub. No.: WO2023/125040
PCT Pub. Date: Jul. 6, 2023

(65) Prior Publication Data
US 2024/0208855 A1 Jun. 27, 2024

(30) Foreign Application Priority Data
Dec. 30, 2021 (CN) .......................... 202111654235.9

(51) Int. Cl.
B32B 15/04 (2006.01)
B32B 17/06 (2006.01)
(Continued)

(52) U.S. Cl.
CPC .............. C03C 10/00 (2013.01); C03B 32/02 (2013.01); C03C 21/002 (2013.01); H05K 5/03 (2013.01); C03C 2204/00 (2013.01)

(58) Field of Classification Search
CPC ...................................................... C03C 21/002
(Continued)

(56) References Cited

U.S. PATENT DOCUMENTS 5,968,857 A * 10/1999 Pinckney ................ C03C 17/22
136/258
11,370,697 B2 * 6/2022 Beall ................... C03C 23/0025
(Continued)

FOREIGN PATENT DOCUMENTS

CN 101905952 A 12/2010
CN 110845153 A 2/2020
(Continued)

OTHER PUBLICATIONS

Feb. 27, 2025, Supplementary European Search Report Issued for European Patent Application No. EP 22 91 4295.
(Continued)

*Primary Examiner* — Lauren R Colgan
(74) *Attorney, Agent, or Firm* — Baratta Law PLLC; Lawrence A. Baratta, Jr.

(57) ABSTRACT

Disclosed is a transparent strengthened glass ceramic having high stress depth. The crystal phase of the strengthened glass ceramic comprises spinel crystals and zirconium oxide crystals, and does not contain Li-containing crystals; the strengthened glass ceramic has a compressive stress region extending from the surface thereof to a compression depth, the depth of a compressive stress layer, DOL_0, of the strengthened glass ceramic is greater than or equal to 14% the thickness of the strengthened glass ceramic, and the tensile stress line density of the strengthened glass ceramic (Continued)

Drop height

Comparative Comparative Example Example Example Example
Example 13 Example 15 11 12 6 5 is greater than or equal to 25,000 MPa/mm. More Li ions and Na ions are introduced into a spinel glass ceramic component, so that a prepared transparent spinel glass ceramic can be chemically strengthened to obtain a transparent strengthened glass ceramic having high CS, DOL_0, CT_AV and CT_LD, and the strengthened glass ceramic shows excellent anti-dropping performance.

20 Claims, 3 Drawing Sheets

(51) Int. Cl.
| | |
|---|---|
| *C03B 32/02* | (2006.01) |
| *C03C 10/00* | (2006.01) |
| *C03C 21/00* | (2006.01) |
| *H05K 5/03* | (2006.01) |

(58) Field of Classification Search
USPC ................................................ 428/410, 426
See application file for complete search history.

(56) References Cited

U.S. PATENT DOCUMENTS

| | | | |
|---|---|---|---|
| 11,542,193 B2 * | 1/2023 | Mitchell | C03C 21/002 |
| 2011/0135964 A1 * | 6/2011 | Yagi | C03C 3/097 |
| | | | 65/33.1 |
| 2015/0099124 A1 * | 4/2015 | Beunet | C03C 10/0054 |
| | | | 65/30.14 |
| 2016/0280589 A1 * | 9/2016 | Beall | C03C 10/0054 |
| 2016/0355434 A1 * | 12/2016 | Momono | C03C 21/002 |
| 2017/0152173 A1 * | 6/2017 | Amin | C03C 21/002 |
| 2017/0341974 A1 * | 11/2017 | Beunet | C03C 21/002 |
| 2019/0161397 A1 * | 5/2019 | Beall | C03C 10/0045 |
| 2020/0172432 A1 * | 6/2020 | Beall | C03C 23/0025 |
| 2020/0407268 A1 * | 12/2020 | Mitchell | C03B 32/02 |
| 2021/0230048 A1 | 7/2021 | Yagi et al. | |
| 2021/0317032 A1 * | 10/2021 | Huang | C03C 10/0027 |
| 2023/0023010 A1 * | 1/2023 | Hu | C03C 10/0027 |
| 2023/0031267 A1 * | 2/2023 | Hu | C03C 10/0036 |
| 2024/0199475 A1 * | 6/2024 | Zhang | C03B 32/02 |

FOREIGN PATENT DOCUMENTS

| | | |
|---|---|---|
| CN | 111615500 A | 9/2020 |
| CN | 111908793 A | 11/2020 |
| CN | 112645589 A | 4/2021 |
| CN | 113365957 A | 9/2021 |
| CN | 113754289 A | 12/2021 |
| JP | S56104747 A | 8/1981 |
| JP | 2007126299 A | 5/2007 |
| JP | 2021505504 A | 2/2021 |
| JP | 2021172547 A | 11/2021 |
| WO | 2016204087 A1 | 12/2016 |
| WO | 2019/108876 A1 | 6/2019 |
| WO | 2020031338 A1 | 2/2020 |
| WO | 2020/264229 A1 | 12/2020 |
| WO | 2021256304 A1 | 12/2021 |

OTHER PUBLICATIONS

Notice of Allowance of the corresponding KR application No. 10-2023-7043056 issued on Mar. 27, 2025.
First Office Action of the priority CN application No. 202111654235.9 issued on Aug. 12, 2025 in connection with the captioned US application.
First Office Action of the corresponding JP application No. 2023-559767 issued on Oct. 15, 2024.
Feb. 24, 2023, International Search Report for International Patent Application No. PCT/CN2022/139283.

* cited by examiner

Relationship between Li$_2$O content and CT_LD

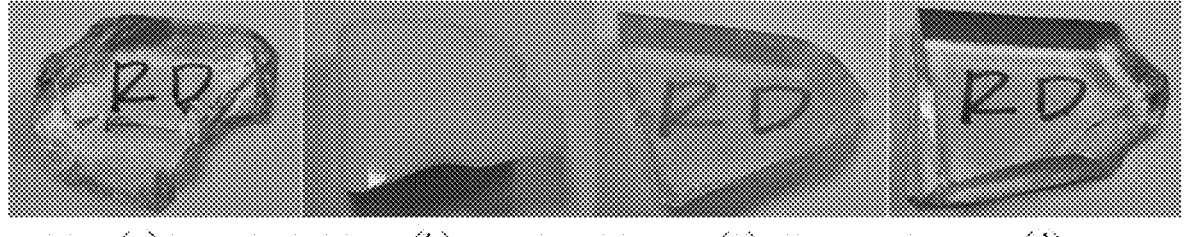
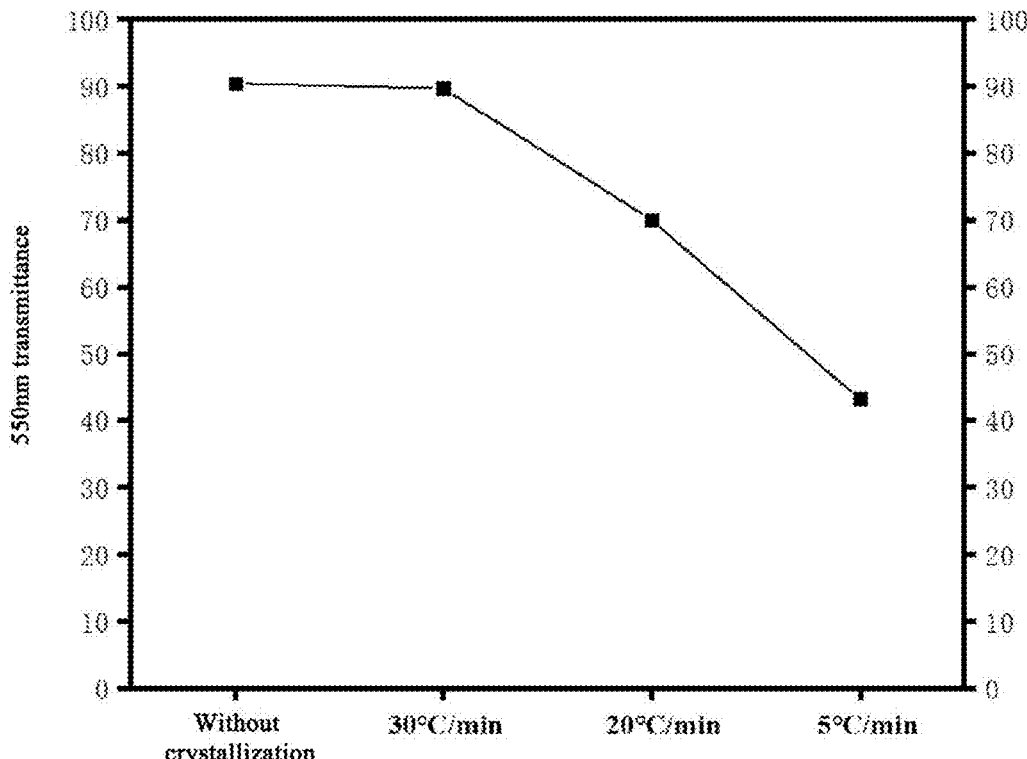
FIG. 5
FIG. 6

TRANSPARENT STRENGTHENED GLASS CERAMIC HAVING HIGH STRESS DEPTH, PREPARATION METHOD THEREFOR AND APPLICATION THEREOF

FIELD OF THE INVENTION

The present invention relates to the technical field of glass technology, in particular to a transparent strengthened glass ceramic having high stress depth and preparation method therefor and application thereof.

BACKGROUND OF THE INVENTION

With the gradual thinning and lightening of electronic devices, the performance requirements for cover glass is increasing. Microcrystalline glass (glass ceramic) has received widespread attention because of the good impact resistance, scratch resistance, wear resistance and other performances thereof. Transparent spinel ceramics not only have the performance characteristics of common advanced ceramics such as high temperature resistance, corrosion resistance, wear resistance, impact resistance, high hardness, and excellent insulation, but also have optical properties similar to those of white sapphire single crystals, and have good optical transmittance in ultraviolet, visible, and infrared bands. Therefore, transparent spinel ceramics are commonly used as transparent armors, guide missile windows, fairings, various substrate materials, new lamps and lanterns, and observation windows for equipment in various high-temperature, high-pressure and corrosive environments. However, although having a high hardness, spinel microcrystalline glass generally cannot be chemically strengthened and toughened, resulting in poor toughness and drop resistance, and the brittleness thereof increases especially when the thickness is small ($\leq 1$ mm). Therefore, it is not suitable for electronic cover glass that requires a high impact resistance.

For electronic cover glass, a relatively high surface compressive stress (CS), depth of compressive stress layer (DOL_0), average center tension (CT_AV) and linear density of center tension (CT_LD), especially a relatively high CT_LD, are required to achieve good drop resistance performance. To achieve relatively high CS, DOL_0, CT_AV and CT_LD, it is necessary to add a certain amount of $Li_2O$ and $Na_2O$ to the glass composition. However, as the amount of $Li_2O$ and $Na_2O$ added into the composition of the spinel glass ceramic increases, crystals in the glass that affect the optical properties of the glass ceramic, e.g., $\beta$ quartz, solid solution of $\beta$ quartz, $\beta$-spodumene and other crystal phases, are precipitated out. Due to the precipitation of such crystals, glass ceramic is prone to haze, and even to devitrification. Thus, it is difficult to obtain an ideal transparent spinel glass ceramic.

Therefore, there is still a urgent problem to be solved by those skilled in the art to develop a new transparent spinel glass ceramic, which not only has an excellent optical property, but also comprises more Li and Na ions for chemically strengthening via ion exchange, and also develop a strengthened glass ceramic by using the transparent spinel glass ceramic, said strengthened glass ceramic having high CS, DOL_0, CT_AV and CT_LD and achieving excellent drop resistance performance.

SUMMARY OF THE INVENTION

An object of the present invention is to provide a transparent strengthened glass ceramic having a high stress depth and showing an excellent drop resistance performance and excellent transmittance.

In order to solve the above technical problem, the following technical solutions are adopted in the present invention.

The present invention provides a transparent strengthened glass ceramic having a high stress depth, wherein, a crystal phase of the strengthened glass ceramic comprises a spinel crystal and a zirconium oxide crystal, and does not contain a Li-containing crystal.

The strengthened glass ceramic has a compressive stress zone extending from a surface of the strengthened glass ceramic to a compressive depth, and a depth of compressive stress layer DOL_0 of the strengthened glass ceramic is greater than or equal to 14% of the thickness of the strengthened glass ceramic, and the linear density of center tension CT_LD of the strengthened glass ceramic is greater than or equal to 25,000 MPa/mm.

In one embodiment, the crystal phase of the strengthened glass ceramic does not comprise quartz and a solid solution of quartz.

In one embodiment, the linear density of center tension CT_LD of the strengthened glass ceramic is 25,000 to 40,000 MPa/mm, preferably 27,000 to 40,000 MPa/mm.

In one embodiment, the surface compressive stress CS of the strengthened glass ceramic is greater than or equal to 650 MPa, preferably greater than or equal to 680 MPa.

In one embodiment, the average center tension CT_AV of the strengthened glass ceramic is greater than or equal to 35.0 MPa, preferably greater than or equal to 39.0 MPa.

In one embodiment, the Vickers hardness of the strengthened glass ceramic is greater than or equal to 740HV0.3.

In one embodiment, the fracture toughness of the strengthened glass ceramic is greater than or equal to 1.500 $MPa \cdot m^{1/2}$, preferably greater than or equal to 1.560 $MPa \cdot m^{1/2}$.

In one embodiment, the spinel crystal comprises a zinc spinel and a magnesium spinel.

In one embodiment, the transmittance of the strengthened glass ceramic with a thickness of 0.7 mm is greater than 85.00% at a light having a wavelength of 550 nm.

In one embodiment, the strengthened glass ceramic exhibits a crystallinity of at least 30.00 wt. %. In one embodiment, the average crystal size in the strengthened glass ceramic is less than or equal to 15.00 nm.

In one embodiment, the strengthened glass ceramic comprises a surface compressive stress layer and an inside tensile stress layer, and in molar percentage of oxides, the tensile stress layer of the strengthened glass ceramic comprises:

$Li_2O$: 3.50 to 6.00 mol %, and $Na_2O$: 2.00 to 4.00 mol %.

In one embodiment, in molar percentage of oxides, the tensile stress layer of the strengthened glass ceramic comprises:

$SiO_2$: 50.00 to 65.00 mol %, $Al_2O_3$: 14.50 to 25.00 mol %,

MgO: 3.50 to 8.00 mol %,

ZnO: 8.00 to 16.00 mol %,

BaO: 0 to 2.00 mol %, and $TiO_2 + ZrO_2$: 3.00 to 5.50 mol %.

In one embodiment, in molar percentage of oxides, the tensile stress layer of the strengthened glass ceramic satisfies:

$$0.40 \leq$$
$$(Al_2O_3 + ZnO + MgO + ZrO_2 + TiO_2)/(Li_2O + Na_2O + SiO_2 + BaO) \leq 0.70.$$

In one embodiment, in molar percentage of oxides, the tensile stress layer of the strengthened glass ceramic satisfies:

$$0.43 \leq$$
$$(Al_2O_3 + ZnO + MgO + ZrO_2 + TiO_2)/(Li_2O + Na_2O + SiO_2 + BaO) \leq 0.68.$$

In one embodiment, in molar percentage of oxides, the tensile stress layer of the strengthened glass ceramic satisfies:

$$Na_2O/(Li_2O + Na_2O + SiO_2 + BaO) \geq 0.035;$$
$$\text{and/or } Li_2O/(Li_2O + Na_2O + SiO_2 + BaO) \geq 0.054.$$

In one embodiment, in molar percentage of oxides, the tensile stress layer of the strengthened glass ceramic satisfies:

$$0.035 \leq Na_2O/(Li_2O + Na_2O + SiO_2 + BaO) \leq 0.070;$$
$$\text{and/or } 0.054 \leq Li_2O/(Li_2O + Na_2O + SiO_2 + BaO) \leq 0.090.$$

In one embodiment, in molar percentage of oxides, the tensile stress layer of the strengthened glass ceramic comprises:

$SiO_2$: 50.00 to 63.00 mol %, preferably 50.00 to 57.00 mol %; and/or $Al_2O_3$: 14.50 to 20.00 mol %, preferably 15.00 to 19.00 mol %; and/or MgO: 3.90 to 7.60 mol %, preferably 4.00 to 7.50 mol %; and/or ZnO: 8.00 to 15.50 mol %, preferably 9.00 to 15.20 mol %; and/or BaO: 0 to 1.50 mol %, preferably 1.00 to 1.35 mol %; and/or $Li_2O$: 3.50 to 5.00 mol %, preferably 4.00 to 5.00 mol %; and/or $Na_2O$: 2.30 to 3.60 mol %, preferably 3.00 to 3.60 mol %; and/or $TiO_2$: 0 to 2.00 mol %, preferably 0.30 to 1.30 mol %; and/or $ZrO_2$: 2.50 to 5.00 mol %, preferably 2.90 to 4.20 mol %.

The present application further provides a preparation method of the transparent strengthened glass ceramic having a high stress depth, comprising:

(1) batching and mixing the raw materials according to a proportion scheme to prepare a glass precursor;

(2) subjecting the prepared glass precursor to nucleation and crystallization successively to prepare a transparent spinel glass ceramic;

(3) subjecting the transparent spinel glass ceramic obtained in step (2) to a one-step or multi-step ion exchange process in a salt bath to obtain the strengthened glass ceramic.

In one embodiment, the nucleation in step (2) is performed at a nucleation temperature of 700° C. to 800° C. for a nucleation time period of 30 to 1440 min; and the crystallization in step (2) is performed at a crystallization temperature of 900° C. to 1000° C. for a crystallization time period of 5 to 1440 min.

In one embodiment, during the crystallization in step (2), the temperature is raised to the crystallization temperature at a heating rate of greater than 20° C./min, preferably greater than or equal to 25° C./min, and more preferably greater than or equal to 30° C./min.

In one embodiment, during the nucleation in step (2), the temperature is raised to the nucleation temperature at a heating rate of 5 to 20° C./min, preferably at a heating rate of 10° C./min.

In one embodiment, during the one-step ion exchange in step (3), the salt bath composition comprises 50 to 100 wt. % $NaNO_3$ and 0 to 50 wt. % $KNO_3$, and the ion exchange is performed at an ion exchange temperature of 400 to 500° C. for an ion exchange time period of 0.5 to 48 hours.

In one embodiment, during the two-step ion exchange in step (3):

in the first step, the salt bath composition comprises 90 to 100 wt. % $NaNO_3$ and 0 to 10 wt. % $KNO_3$, and the ion exchange is performed at an ion exchange temperature of 400 to 500° C. for an ion exchange time period of 0.5 to 48 hours; and in the second step, the salt bath composition comprises 0 to 10 wt. % $NaNO_3$ and 90 to 100 wt. % $KNO_3$, and the ion exchange is performed at an ion exchange temperature of 400 to 500° C. for an ion exchange time period of 0.5 to 48 hours.

In order to improve the service life of the salt bath, a salt bath protector can be added to the salt bath at a mass percentage of 0.1 to 5 wt. %. The salt bath protector comprises materials used for passivation, precipitation, or absorption of Lit.

The present invention also provides an electronic terminal as a consumer product, comprising: a housing, comprising a front surface, a back surface, and a side surface; and an electronic assembly partially located in the housing, comprising a display device located on or adjacent to the front surface of the housing; and a covering product configured to cover the front surface of the housing or dispose on the display device, wherein the covering product comprises the strengthened glass ceramic material; and wherein the front surface and/or the back surface and/or the side surface comprises the strengthened glass ceramic material; and wherein the electronic terminal as a consumer product comprises mobile phones, tablet computers, photovoltaic devices, or other electronic terminals (e.g., electronic watches, etc.).

Both the transparent spinel glass ceramic material and the strengthened glass ceramic material of the present invention have excellent performances, and can be contained in/applied to other article of manufactures such as watches, transparent armors, guide missile windows, fairings, substrate materials, new lamps and lanterns, observation windows for equipment used in high-temperature, high-pressure and corrosive environments, display protection materials and exterior housing protection materials for portable intelligent electronic devices (portable intelligent electronic devices including mobile phones, tablet computers, electronic watches, etc.), building products, transportation products (e.g. automobiles, trains, aircrafts, marine vehicles, etc.), utensil products, or any products that require a certain degree of transparency, scratch resistance, impact resistance, wear resistance, or any combinations thereof.

The invention has the following beneficial effects over the prior art.

1. According to the invention, components of a spinel glass ceramic material are optimized by introducing into the spinel glass ceramic more Li ions and Na ions used for chemical strengthening via ion exchange, such that a spinel glass ceramic without an impurity crystal phase (e.g., Li-containing crystal phase, quartz, solid solution of quartz, and other impurity crystal phases) is obtained, which does not exhibit phenomena such as haze and devitrification, ensuring that the glass ceramic material has an excellent transmittance.

Further, more Li ions and Na ions are introduced into the spinel glass ceramic, such that the prepared spinel glass ceramic can be chemically strengthened to obtain a transparent strengthened glass ceramic having high CS, DOL_0, CT_AV and CT_LD, and the strengthened glass ceramic shows excellent drop resistance performance.

2. After performance tests of the glass ceramic material prepared in the invention, it is found that the transparent spinel glass ceramic material of the present invention has a high crystallinity, which brings excellent mechanical properties to the glass ceramic material.

3. The present invention also provides a preparation method of the spinel glass ceramic. By controlling the process parameters of the crystallization process and the nucleation process and setting the parameter requirements of the heating rate, the spinel glass ceramic without an impurity crystal phase (e.g., Li-containing crystal phase, quartz, solid solution of quartz and other impurity crystal phases) are finally obtained, and excellent optical properties of the glass ceramic material are ensured.

DESCRIPTION OF THE DRAWINGS

FIG. 5 shows photos of glass ceramics prepared by using different heating rates during crystallization, wherein:

Figure 1:
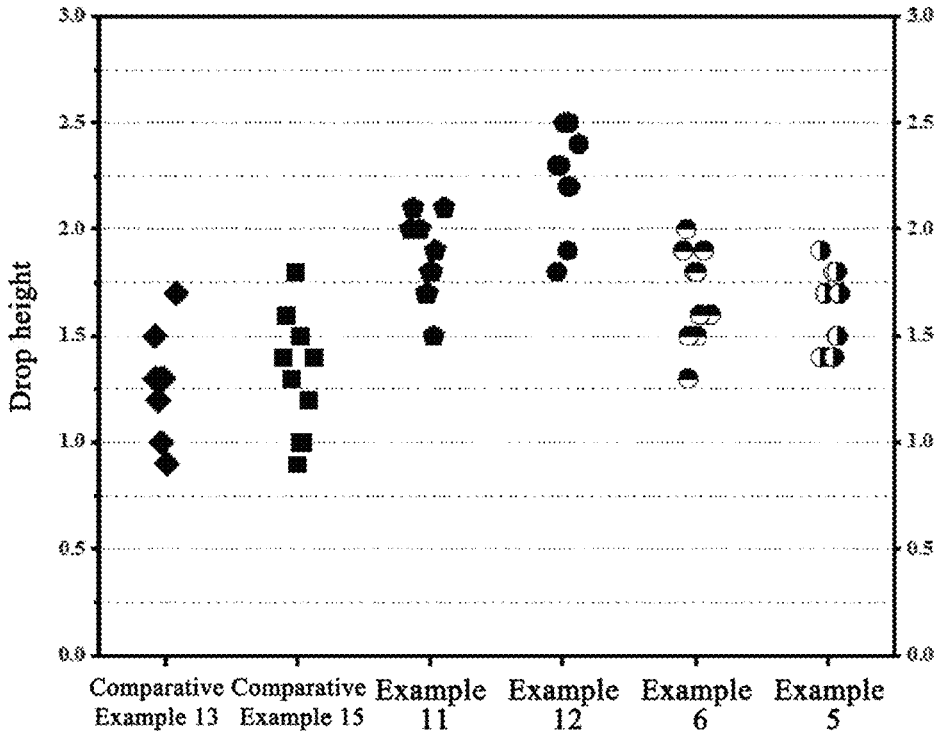
FIG. 1 is a diagram showing the performance in drop test of a complete machine.
Figure 2:
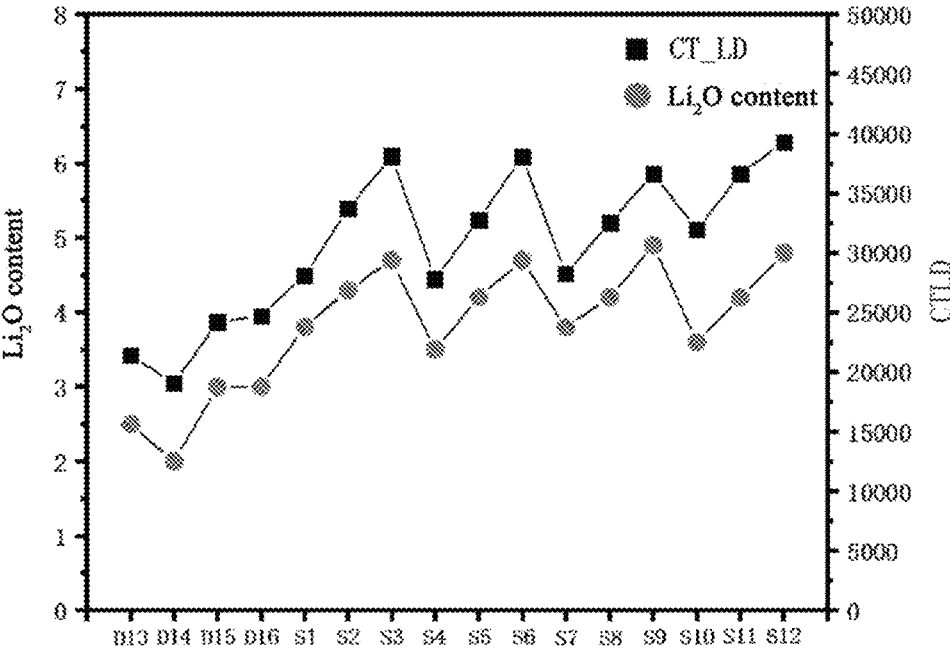
FIG. 2 shows the relationship between $Li_2O$ content and CT_LD, wherein D represents comparative example and S represents example.

(a) represents a glass without a heat treatment;

(b) represents a glass ceramic prepared by using a heating rate of 5° C./min during crystallization;

(c) represents a glass ceramic prepared by using a heating rate of 20° C./min during crystallization; and (d) represents a glass ceramic prepared by using a heating rate of 30° C./min during crystallization.

FIG. 6 shows the transmittance of glass ceramics prepared at different heating rates during crystallization for light with a wavelength of 550 nm.

DETAILED DESCRIPTION OF THE INVENTION

The present invention will be further illustrated in detail in combination with examples and accompanying drawings.

I. Relevant specialized terms and measurement methods involved in the present application are explained as follows.

Glass ceramic: also known as microcrystalline glass, is a type of solid composite material that includes both glass and microcrystalline phases, which is prepared by targeted controlled crystallization of basic glass.

Strengthened glass ceramic: is a solid composite material obtained by chemical strengthening of a glass ceramic. During high-temperature chemical strengthening, alkali metal ions with large ionic radius (such as potassium ions and sodium ions) in the salt bath will replace alkali metal ions with small ionic radius (such as sodium ions and lithium ions) in the glass ceramic, resulting in volume difference between the exchanged ions, such that a compressive stress is generated on the surface of the glass ceramic.

Surface compressive stress CS: after chemical strengthening of a glass ceramic, alkali metal ions with smaller radii at the surface are replaced by alkali metal ions with larger radii, and due to the ion-stuffing effect of alkali metal ions with larger radii, compressive stress is generated on the glass surface, which is called surface compressive stress.

Depth of compressive stress layer DOL_0: refers to the distance from the surface of the strengthened glass ceramic to the position where the compressive stress is zero.

Linear density of center tension CT_LD: the ratio of the sum of tensile stress obtained from tests using SLP stress instrument to the thickness of glass ceramic. After chemical strengthening, a tensile stress layer is formed inside the strengthened glass ceramic. The tensile stress layer has an upper boundary that is separated from the upper surface of the strengthened glass ceramic by a certain distance, and a lower boundary that is separated from the lower surface of the strengthened glass ceramic by a certain distance. The tensile stress curve is recorded and drawn as a curve, in which the Y-axis refer to the tensile stress at a point on a line segment, which is in the tensile stress layer and is perpendicular to both the upper and lower boundaries, with the upper and lower endpoints falling on the upper and lower boundaries respectively, and the X-axis refers to the distance between said point and the upper boundary. The ratio of the definite integral of the tensile stress curve to the thickness of the strengthened glass ceramic is recorded as the linear density of center tension. That is, the linear density of center tension refers to the ratio of the sum of the tensile stress of strengthened glass ceramic measured by the SLP-2000 stress instrument to the thickness of the glass.

The compressive stress and tensile stress of chemically strengthened glass are balanced and equal, while the SLP-2000 stress instrument is more accurate in measuring the tensile stress zone of glass. Therefore, the ratio of the integral of tensile stress to thickness is used to characterize the stress in a unit thickness of glass ceramic, which reflects the stress level of the chemically strengthened glass ceramic.

CT_AV: refers to the average of all tensile stress in the tensile stress zone.

Nucleation temperature: the temperature at which crystal nuclei form.

Crystallization temperature: the temperature at which the growth rate of the target crystal can be controlled.

Transmittance: when light with a certain wavelength is irradiated on the glass surface, it will be reflected, absorbed, and pass through, and transmittance refers to the ratio of the intensity of the transmitted part to the intensity of the incident light.

Haze: due to the large size of crystals or phase separation in glass ceramic, the glass ceramic appears as a semitransparent state, between the transparent and the opaque state.

Devitrification: due to the large size of crystals or phase separation in glass ceramic, the transparent property of glass is completely lost, and no image on the back can be seen through the glass.

Differential Scanning Calorimetry (DSC) Test

The sample is grinded and sieved through a 200-mesh sieve.

Test conditions: room temperature to 1100° C., with a heating rate of 10° C./min.

Test instrument: Mettler Toledo TGA/DSC 3+ thermogravimetric and synchronous thermal analyzer.

Test of Transmittance

The crystallized glass sheet is firstly cleaned in an ultrasonic cleaning machine, wherein the cleaning conditions include:

cleaning time: 5 minutes to 10 minutes;

the cleaning agent used: a commonly used detergent diluted 10 times;

cleaning temperature: 45° C. to 65° C.;

cleaning frequency: 20 KHZ to 40 KHZ.

Then a haze meter is used to test the transmittance of the glass at different wavelengths, in accordance with the standard "GB/T 7962.12-2010 Colorless Optical Glass Test Methods—Part 12: Transmittance within the spectrum".

The haze meter used in the present invention is Konica Minolta spectrophotometer CM-3600A, Japan.

Drop Test of Complete Machine:

Firstly, a 120-mesh sand paper is pasted on a 160 g Huawei P30 model machine, and a strengthened glass ceramic sheet to be tested with a size of 50×50×0.7 mm is placed directly below the model machine. Then the model machine is dropped from the specified height in the form of impact.

Taking at least 10 samples per batch, with a drop height starting from 0.4 m, each sample is subjected to a drop impact. If the sample is not broken, it shall be dropped again by increasing the height by 0.1 m each time until the glass is broken. The average value of the heights prior to broken is taken as the drop resistance height.

In the present invention, stress can be measured by FSM6000 and SLP2000 produced by Orihara company on the surface high-compressive stress zone and deep low-compressive stress zone, respectively, and the stress curve can be fitted using PMC software to obtain corresponding test results. Certainly, other stress testers that can measure the surface high-compressive stress zone and deep low-compressive stress zone can also be used.

II. The present invention provides a transparent spinel glass ceramic, and in molar percentage of oxides, the glass ceramic comprises:

Li$_2$O: 3.50 to 6.00 mol %, and

Na$_2$O: 2.00 to 4.00 mol %:

wherein a crystal phase of the glass ceramic has a spinel crystal and a zirconia crystal, and does not comprise a Li-containing crystal.

Figure 3:
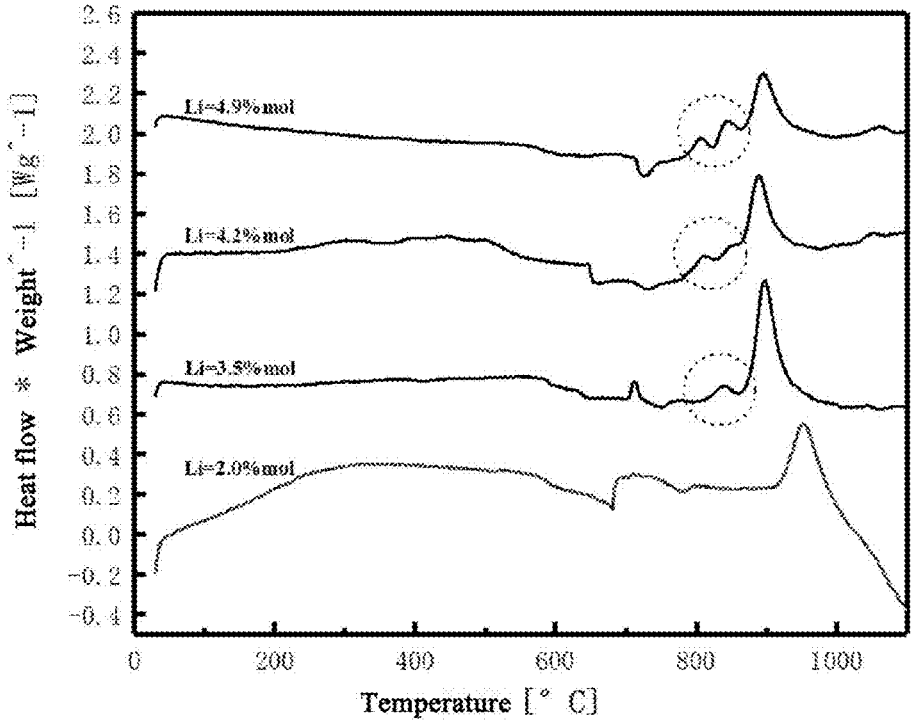
FIG. 3 shows the DSC diagram of glass precursors with different Li contents.

In the present invention, targeted research on the composition of glass ceramic materials is conducted. In order to toughen a glass ceramic by chemical strengthening, and to achieve high CS, DOL_0, CT_AV and CT_LD as well as to improve the impact resistance and drop resistance, it is inevitable to add alkali metal oxides, especially Li$_2$O (lithium oxide) and Na$_2$O (sodium oxide), to the composition. However, as the amount of Li$_2$O and Na$_2$O added increases, impurity crystals that affect the optical properties of the glass ceramic, e.g., β quartz, solid solution of β quartz, β-spodumene and other crystal phases, are generally precipitated in the glass. This is well proved by FIG. 3. As the Li$_2$O content increases, the single peak formed by spinel in FIG. 3 gradually changes to multiple peaks (spinel peak+ other peaks of impurity crystal phases). Due to the precipitation of these impurity crystals, a crystallized glass is prone to haze, and even to devitrification, which will seriously affect the optical properties of glass ceramic.

In this regard, it is common in the prior art to reduce the amount of Li$_2$O and Na$_2$O added to avoid excessive precipitation of β quartz, solid solution of β quartz, β-spodumene and other crystal phases, thereby avoiding haze and devitrification of glass ceramics. However, this method will inevitably lead to relatively low CS, DOL_0, CT_AV and CT_LD obtained through strengthening of glass ceramic, and it will be difficult to achieve an excellent drop resistance performance.

In order to obtain a strengthened transparent spinel glass ceramic with high CS, DOL_0, CT_AV and CT_LD, and to improve the drop resistance performance of the spinel glass ceramic, the present invention makes an optimization on the composition.

In the present invention, a spinel glass ceramic without impurity crystal phases (e.g., Li-containing crystal phase, quartz, solid solution of quartz, and other impurity crystal phases) is obtained when more Li$_2$O and Na$_2$O are introduced. The glass ceramic does not appear phenomena such as haze and devitrification, thus ensuring that the glass ceramic has an excellent transmittance. Additionally, more Li ions and Na ions are introduced into the spinel glass ceramic composition, so that the prepared spinel glass ceramic is chemically strengthened, and thus a transparent strengthened glass ceramic having high CS, DOL_0, CT_AV and CT_LD and an excellent drop resistance performance is obtained.

In the transparent spinel glass ceramic provided in the present invention:

the content of Li$_2$O comprises the range of 3.50 to 6.00 mol % and all ranges and subranges therein, e.g., 3.50 to 5.00 mol %, 4.50 to 5.00 mol %, 4.50 to 5.50 mol %, 3.50 to 4.50 mol %, 4.00 to 5.00 mol %, 4.50 to 6.00 mol %, 5.00 to 6.00 mol %, 5.50 to 6.00 mol %, 3.50 to 4.00 mol %, 3.50 to 4.40 mol %, 3.80 to 5.50 mol %, 3.90 to 4.00 mol %, 3.60 to 4.40 mol %, 4.80 to 5.90 mol % and the like. In some embodiments, the content of Li$_2$O may be 3.50 mol %, 3.60 mol %, 3.70 mol %, 3.80 mol %, 3.90 mol %, 4.00 mol %, 4.10 mol %, 4.20 mol %, 4.30 mol %, 4.40 mol %, 4.50 mol %, 4.60 mol %, 4.70 mol %, 4.80 mol %, 4.90 mol %, 5.00 mol %, 5.10 mol %, 5.20 mol %, 5.30 mol %, 5.40 mol %, 5.50 mol %, 5.60 mol %, 5.70 mol %, 5.80 mol %, 5.90 mol %, 6.00 mol % and the like; and/or the content of Na$_2$O comprises the range of 2.00 to 4.00 mol % and all ranges and subranges therein, e.g., 2.30 to 3.60 mol %, 3.00 to 3.60 mol %, 2.5 to 3.00 mol %, 2.40 to 3.80 mol %, 2.00 to 2.60 mol %, 2.00 to 2.80 mol %, 2.50 to 3.20 mol %, 2.50 to 3.60 mol %, 2.50 to 3.10 mol %, 2.50 to 3.40 mol %, 2.50 to 3.80 mol %, 2.80 to 3.50 mol %, 2.10 to 3.90 mol % and the like. In some embodiments, the content of Na$_2$O may be 2.00 mol %, 2.10 mol %, 2.20 mol %, 2.30 mol %, 2.40 mol %, 2.50 mol %, 2.60 mol %, 2.70 mol %, 2.80 mol %, 2.90 mol %, 3.00 mol %, 3.10 mol %, 3.20 mol %, 3.30 mol %, 3.40 mol %, 3.50 mol %, 3.60 mol %, 3.70 mol %, 3.80 mol %, 3.90 mol %, 4.00 mol % and the like.

In some embodiments, the crystal phase of the glass ceramic does not comprise quartz or a solid solution of quartz. The presence of quartz and solid solution of quartz will affect the optical properties of spinel glass ceramic, and make a crystallized glass being prone to haze, and even to devitrification.

In some embodiments, the glass ceramic has a crystallinity of at least 30.00 wt. %; and the average crystal size in the glass ceramic is less than or equal to 15.0 nm. By controlling a sufficiently high crystallinity, the intrinsic strength of the glass ceramic can be significantly improved. Besides, by controlling the crystal size to ensure that the crystal size is small enough, the transparency of the glass ceramic can be significantly improved, ensuring that the glass ceramic has excellent optical properties. The glass ceramic of the present invention has a crystallinity of at least 30.00 wt. %, including the range of greater than or equal to 30.00 wt. % and all ranges and subranges therein, e.g., 30.00 to 50.00 wt. %, 30.00 to 40.00 wt. %, 40.00 to 50.00 wt. %, 35.00 to 40.00 wt. %, 30.00 to 44.00 wt. %, 31.00 to 35.00 wt. %, 42.00 to 45.00 wt. %, 31.00 to 37.00 wt. %, 30.00 to 38.00 wt. %, 30.00 to 39.00 wt. % and the like. In some embodiments, the crystallinity of the glass ceramic of the present invention can be 30.00 wt. %, 31.00 wt. %, 32.00 wt. %, 33.00 wt. %, 34.00 wt. %, 35.00 wt. %, 36.00 wt. %, 37.00 wt. %, 38.00 wt. %, 39.00 wt. %, 40.00 wt. %, 41.00 wt. %, 42.00 wt. %, 43.00 wt. %, 44.00 wt. %, 45.00 wt. %, 46.00 wt. %, 47.00 wt. %, 48.00 wt. %, 49.00 wt. %, 50.00 wt. % and the like. Further, the average crystal size of the glass ceramic of the present invention is smaller than or equal to 15.0 nm, including the range of smaller than or equal to 15.0 nm and all ranges and subranges therein, e.g., 5.0 to 10.0 nm, 5.0 to 11.0 nm, 5.0 to 13.0 nm, 4.0 to 10.0 nm, 3.0 to 15.0 nm, 6.0 to 13.0 nm, 7.0 to 12.0 nm, 2.0 to 10.0 nm, 5.0 to 14.0 nm, 4.0 to 9.0 nm and the like. In some embodiments, the average crystal size of the glass ceramic of the present invention can be 2.0 nm, 3.0 nm, 4.0 nm, 5.0 nm, 6.0 nm, 7.0 nm, 9.0 nm, 10.0 nm, 11.0 nm, 12.0 nm, 13.0 nm, 14.0 nm, 15.0 nm and the like.

In some embodiments, the spinel crystal includes zinc spinel and magnesium spinel, and/or a solid solution of zinc spinel ($ZnAl_2O_4$) and magnesium spinel ($MgAl_2O_4$). Zinc spinel ($ZnAl_2O_4$) is a cubic mineral, which has a hardness of 7.5 to 8 according to Mohs scale classification, and has a measured density of 4.38 to 4.60 g/cm$^3$. Under environmental pressure, zinc spinel has a Young's modulus of 290 GPa, a shear modulus of 146 GPa, and a refractivity of 1.79 to 1.80. Zinc spinel ($ZnAl_2O_4$) can form a solid solution with magnesium spinel ($MgAl_2O_4$), and the properties of the spinel solid solution are almost the same as those of zinc spinel ($ZnAl_2O_4$). The differences include (magnesium spinel vs. zinc spinel): (a) relatively low refractivity (magnesium spinel: 1.72; zinc spinel: 1.79 to 1.80); (b) low density (magnesium spinel: 3.6 to 4.1 g/cm$^3$; zinc spinel: 4.4 to 4.6 g/cm$^3$); (c) relatively low Young's modulus (magnesium spinel: 283 GPa; zinc spinel: 290 GPa); and (d) relatively high shear modulus (magnesium spinel: 155 GPa; zinc spinel: 146 GPa). The high hardness, high density, and high elastic constant of zinc magnesium spinel make the mechanical properties of composite microcrystalline glass superior to that of the precursor glass, because the composite microcrystalline glass is a function of the mechanical properties of each component. Zinc magnesium spinel microcrystalline glass exhibits excellent crack propagation resistance and scratch resistance.

In some embodiments, with a thickness of 0.7 mm, the transmittance of the glass ceramic at a light having a wavelength of 550 nm is greater than 85.00%. The glass ceramic of the present invention is transparent in the visible light range and exhibits a transmittance of at least about 85.00% at a light having a wavelength of 550 nm. The transmittance of the glass ceramic of the present invention at a light having a wavelength of 550 nm is greater than 85.00%, including the range of greater than 85.00% and all ranges and subranges therein, e.g., 86.00%, 87.00%, 88.00%, 89.00%, 90.00%, 91.00%, 92.00%, 93.00% and the like.

In some embodiments, in molar percentage of oxides, the glass ceramic of the present invention further comprises:

$SiO_2$: 50.00 to 65.00 mol %, $Al_2O_3$: 14.50 to 25.00 mol %,

MgO: 3.50 to 8.00 mol %,

ZnO: 8.00 to 16.00 mol %,

BaO: 0 to 2.00 mol %, and $TiO_2+ZrO_2$: 3.00 to 5.50 mol %.

Further, in molar percentage of oxides, the glass ceramic of the present invention further comprises:

$SiO_2$: 50.00 to 63.00 mol %, preferably 50.00 to 57.00 mol %; and/or $Al_2O_3$: 14.50 to 20.00 mol %, preferably 15.00 to 19.00 mol %; and/or MgO: 3.90 to 7.60 mol %, preferably 4.00 to 7.50 mol %; and/or ZnO: 8.00 to 15.50 mol %, preferably 9.00 to 15.20 mol %; and/or BaO: 0 to 1.50 mol %, preferably 1.00 to 1.35 mol %; and/or $Li_2O$: 3.50 to 5.00 mol %, preferably 4.00 to 5.00 mol %; and/or $Na_2O$: 2.30 to 3.60 mol %, preferably 3.00 to 3.60 mol %; and/or $TiO_2$: 0 to 2.00 mol %, preferably 0.30 to 1.30 mol %; and/or $ZrO_2$: 2.50 to 5.00 mol %, preferably 2.90 to 4.20 mol %.

The present invention may have the following characters.

$SiO_2$ (silicon dioxide) and $Al_2O_3$ (aluminum oxide) are the main components that make up the glass network structure. Sufficient amounts of $SiO_2$ and $Al_2O_3$ ensure that the glass has a high network structure strength, which is conducive to the glass to have a high intrinsic strength and a thermal stability. Excessive amount of $SiO_2$ and $Al_2O_3$ will increase the difficulty for the melting and manufacture of glass. $Al_2O_3$ not only provides Al element for the precipitation of spinel crystals, but also enhances the surface compressive stress during chemical strengthening. MgO (magnesium oxide) and ZnO (zinc oxide) can provide the necessary Mg and Zn elements for the formation of the spinel crystals in the glass ceramic, in which MgO can increase the high-temperature viscosity of glass liquid, reduce the crystallization tendency and crystallization rate, and improve the chemical stability and mechanical strength of the glass; and ZnO, as an intermediate of the network, can consume free oxygen in the glass to form $[ZnO_4]$ and enter the structural network of the glass, making the structure of the glass more stable, but excessive amount of ZnO will make the glass being prone to crystal precipitation. Therefore, adjusting the ratio of MgO and ZnO can control the precipitation rate of the crystal.

BaO (barium oxide) will accelerate the melting of glass. However, when the content of BaO is too high, secondary bubbles are easily formed, which makes it difficult for clarification.

$TiO_2$ (titanium oxide) and $ZrO_2$ (zirconia) are used as nucleating agents. $ZrO_2$ can increase the viscosity and chemical stability of glass, but excessive amount thereof will increase the difficulty for the melting of glass. $TiO_2$ can improve the chemical stability of glass and increase the uniformity of the melting and manufacture of glass, but excessive amount thereof will lead to coloring and increase the refractivity of glass. The combination of $TiO_2$ and $ZrO_2$ can achieve a good nucleation effect.

The content of $SiO_2$ comprises the range of 50.00 to 65.00 mol % and all ranges and subranges therein, e.g., 50.00 to 63.00 mol %, 50.00 to 65.00 mol %, 50.00 to 60.00 mol %, 51.00 to 63.00 mol %, 52.00 to 65.00 mol %, 53.00 to 65.00 mol %, 55.00 to 65.00 mol %, 50.00 to 57.00 mol %, 52.00 to 57.00 mol % and the like. In some embodiments, the content of $SiO_2$ can be 50.00 mol %, 51.00 mol %, 52.00 mol %, 53.00 mol %, 54.00 mol %, 55.00 mol %, 56.00 mol %, 57.00 mol %, 58.00 mol %, 59.00 mol %, 60.00 mol %, 61.00 mol %, 62.00 mol %, 63.00 mol %, 64.00 mol %, 65.00 mol % and the like.

The content of $Al_2O_3$ comprises the range of 14.50 to 25.00 mol % and all ranges and subranges therein, e.g., 14.50 to 20.00 mol %, 15.00 to 19.00 mol %, 14.50 to 20.00 mol %, 15.50 to 20.00 mol %, 15.00 to 24.00 mol %, 14.90 to 23.00 mol %, 16.00 to 24.00 mol %, 17.00 to 25.00 mol %, 18.00 to 25.00 mol % and the like. In some embodiments, the content of $Al_2O_3$ can be 14.50 mol %, 14.90 mol %, 15.00 mol %, 15.50 mol %, 16.00 mol %, 17.00 mol %, 18.00 mol %, 19.00 mol %, 20.00 mol %, 23.00 mol %, 24.00 mol %, 25.00 mol % and the like.

The content of MgO comprises the range of 3.50 to 8.00 mol % and all ranges and subranges therein, e.g., 4.00 to 7.50 mol %, 3.90 to 7.60 mol %, 3.50 to 4.00 mol %, 3.50 to 5.00 mol %, 3.50 to 6.00 mol %, 3.50 to 7.00 mol %, 4.50 to 6.00 mol %, 5.50 to 8.00 mol %, 6.50 to 8.00 mol % and the like. In some embodiments, the content of MgO can be 3.50 mol %, 3.90 mol %, 4.00 mol %, 4.50 mol %, 5.00 mol %, 5.50 mol %, 6.00 mol %, 6.50 mol %, 7.00 mol %, 7.50 mol %, 7.60 mol %, 8.00 mol % and the like.

The content of ZnO comprises the range of 8.00 to 16.00 mol % and all ranges and subranges therein, e.g., 8.00 to 15.50 mol %, 9.00 to 15.20 mol %, 8.00 to 13.00 mol %, 9.00 to 16.00 mol %, 10.00 to 16.00 mol %, 8.00 to 10.00 mol %, 8.00 to 11.00 mol %, 8.00 to 12.00 mol %, 9.00 to 14.00 mol %, 9.00 to 12.00 mol % and the like. In some embodiments, the content of ZnO can be 8.00 mol %, 9.00 mol %, 10.00 mol %, 11.00 mol %, 12.00 mol %, 13.00 mol %, 14.00 mol %, 15.20 mol %, 15.50 mol %, 16.00 mol % and the like.

The content of BaO comprises the range of 0 to 2.00 mol % and all ranges and subranges therein, e.g., 0 to 1.50 mol %, 1.00 to 1.40 mol %, 0 to 1.00 mol %, 1.00 to 2.00 mol %, 1.10 to 2.00 mol %, 1.20 to 2.00 mol %, 1.10 to 1.50 mol %, 1.20 to 1.80 mol % and the like. In some embodiments, the content of BaO can be 0 mol %, 1.00 mol %, 1.10 mol %, 1.20 mol %, 1.40 mol %, 1.50 mol %, 1.80 mol %, 2.00 mol % and the like.

The content of $TiO_2+ZrO_2$ comprises the range of 3.00 to 5.50 mol % and all ranges and subranges therein, e.g., 3.00 to 5.00 mol %, 3.50 to 5.00 mol %, 4.50 to 5.00 mol %, 3.10 to 4.50 mol %, 3.30 to 4.70 mol %, 3.70 to 4.50 mol %, 3.10 to 4.80 mol %, 4.00 to 5.00 mol %, 3.00 to 4.20 mol %, 3.20 to 5.10 mol %, 3.40 to 5.40 mol %, 3.70 to 5.20 mol %, 3.00 to 4.00 mol % and the like. In some embodiments, the content of $TiO_2+ZrO_2$ can be 3.00 mol %, 3.10 mol %, 3.20 mol %, 3.30 mol %, 3.40 mol %, 3.50 mol %, 3.70 mol %, 4.00 mol %, 4.20 mol %, 4.50 mol %, 4.70 mol %, 4.80 mol %, 5.00 mol %, 5.10 mol %, 5.20 mol %, 5.40 mol %, 5.50 mol % and the like.

The content of $TiO_2$ comprises the range of 0 to 2.00 mol % and all ranges and subranges therein, e.g., 0.10 to 1.00 mol %, 0.50 to 1.00 mol %, 0.20 to 1.90 mol %, 0.40 to 1.20 mol %, 0.60 to 1.50 mol %, 0.80 to 1.00 mol %, 0.30 to 1.80 mol %, 0.20 to 1.50 mol %, 0.30 to 1.30 mol %, 0.10 to 1.70 mol % and the like. In some embodiments, the content of $TiO_2$ can be 0 mol %, 0.10 mol %, 0.20 mol %, 0.30 mol %, 0.40 mol %, 0.50 mol %, 0.60 mol %, 0.80 mol %, 0.90 mol %, 1.00 mol %, 1.20 mol %, 1.30 mol %, 1.50 mol %, 1.70 mol %, 1.80 mol %, 1.90 mol %, 2.00 mol % and the like.

The content of $ZrO_2$ comprises the range of 2.50 to 5.00 mol % and all ranges and subranges therein, e.g., 2.60 to 4.50 mol %, 2.70 to 4.50 mol %, 2.90 to 4.20 mol %, 2.90 to 3.50 mol %, 2.80 to 3.70 mol %, 2.50 to 3.10 mol %, 2.60 to 4.60 mol %, 3.50 to 5.00 mol %, 4.50 to 5.00 mol %, 3.10 to 4.50 mol %, 3.20 to 4.30 mol %, 2.90 to 3.80 mol %, 2.70 to 3.80 mol % and the like. In some embodiments, the content of $ZrO_2$ can be 2.50 mol %, 2.60 mol %, 2.70 mol %, 2.80 mol %, 2.90 mol %, 3.10 mol %, 3.20 mol %, 3.50 mol %, 3.70 mol %, 3.80 mol %, 4.20 mol %, 4.30 mol %, 4.50 mol %, 4.60 mol %, 5.00 mol % and the like.

After batching, a clarifying agent may be added to the mixed raw material. The clarifying agent is not specifically limited and can be sodium chloride (NaCl), tin oxide, and the like. The amount of the clarifying agent shall not exceed 2 wt. % of the weight of the mixed raw material. For example, if the weight of the mixed raw material prepared according to the proportion scheme is 1 kg, the amount of the clarifying agent added shall not exceed 20 g. The clarifying agent is an additional auxiliary ingredient added during batching.

In some embodiments, in molar percentage of oxides, the glass ceramic satisfies: $0.40 \le (Al_2O_3+Zn_O+MgO+ZrO_2+TiO_2)/(Li_2O+Na_2O+SiO_2+BaO) \le 0.70$. In the present invention, by configuring the crystallizable glass to have such a specified ratio, the glass ceramics manufactured from these crystallizable glass can have the characteristics described in the present invention, including the composition and/or quantity and/or structure of zinc spinel and magnesium spinel. For example, the components in the glass ceramic can be specified to meet the aforementioned molar ratio, so that the glass ceramic contains zinc spinel, magnesium spinel, and glass phase, thereby affecting the properties and/or characteristics of the glass ceramic manufactured therefrom. For example, the crystallinity of the glass ceramic can be enhanced to confer a superior intrinsic strength, while also achieving a higher transmittance and a fast and effective ion exchange. By configuring the crystallizable glass in this way, this ratio allows for actual conversion processes (e.g., temperature and/or time period for nucleation and crystallization), while also allowing the replicated and reliably formation of glass ceramics characterized by the required excellent optical properties and intrinsic strength. The ratio of $(Al_2O_3+ZnO+MgO+ZrO_2+TiO_2)/(Li_2O+Na_2O+SiO_2+BaO)$ comprises the range of 0.40 to 0.70 and all ranges and subranges therein, e.g., 0.41 to 0.51, 0.43 to 0.68, 0.42 to 0.60, 0.43 to 0.55, 0.44 to 0.58, 0.42 to 0.68, 0.45 to 0.69, 0.46 to 0.62, 0.41 to 0.54, 0.43 to 0.54, 0.44 to 0.59, 0.49 to 0.70 and the like. In some embodiments, the ratio of $(Al_2O_3+ZnO+MgO+ZrO_2+TiO_2)/(Li_2O+Na_2O+SiO_2+BaO)$ can be 0.40, 0.41, 0.42, 0.43, 0.44, 0.45, 0.46, 0.47, 0.48, 0.49, 0.50, 0.51, 0.52, 0.53, 0.54, 0.55, 0.56, 0.57, 0.58, 0.59, 0.60, 0.61, 0.62, 0.63, 0.64, 0.65, 0.66, 0.67, 0.68, 0.69, 0.70 and the like.

In some embodiments, in molar percentage of oxides, the glass ceramic satisfies: $Na_2O/(Li_2O+Na_2O+SiO_2+BaO) \ge 0.035$; and/or $Li_2O/(Li_2O+Na_2O+SiO_2+BaO) \ge 0.054$. Further research was conducted on the relationship between $Na_2O$ and $Li_2O$ with other components. It is found that by controlling the amounts of $Na_2O$ and/or $Li_2O$ with other components within the specified ratio ranges, the glass ceramic is ensured to have an excellent ion exchange ability, and the obtained transparent spinel glass ceramic is ensured to achieve high CS, DOL_0, CT_AV and CT_LD through chemically strengthening via ion exchange.

The ratio of $Na_2O/(Li_2O+Na_2O+SiO_2+BaO)$ comprises the range of greater than or equal to 0.035 and all ranges and subranges therein, e.g., 0.035 to 0.070, 0.039 to 0.058, 0.035 to 0.051, 0.035 to 0.052, 0.035 to 0.055, 0.040 to 0.060, 0.055 to 0.060, 0.038 to 0.052 and the like. In some embodiments, the ratio of $Na_2O/(Li_2O+Na_2O+SiO_2+BaO)$ can be 0.035, 0.036, 0.037, 0.038, 0.039, 0.040, 0.043, 0.045, 0.048, 0.050, 0.051, 0.052, 0.055, 0.058, 0.060, 0.063, 0.065, 0.068, 0.070, and the like.

The ratio of $Li_2O/(Li_2O+Na_2O+SiO_2+BaO)$ comprises the range of greater than or equal to 0.054 and all ranges and subranges therein, e.g., 0.054 to 0.090, 0.055 to 0.080, 0.056 to 0.074, 0.058 to 0.073, 0.056 to 0.071, 0.059 to 0.077, 0.055 to 0.065, 0.055 to 0.075, and the like. In some embodiments, the ratio of $Li_2O/(Li_2O+Na_2O+SiO_2+BaO)$ can be 0.054, 0.055, 0.056, 0.058, 0.059, 0.060, 0.063, 0.065, 0.068, 0.070, 0.071, 0.073, 0.074, 0.075, 0.077, 0.080, 0.083, 0.085, 0.088, 0.090 and the like.

III. The present application provides a preparation method of the transparent spinel glass ceramic, comprising the steps of:

(1) batching and mixing raw materials according to a proportion scheme to prepare a glass precursor; and (2) subjecting the prepared glass precursor to nucleation and crystallization successively to prepare the transparent spinel glass ceramic.

In the present invention, the raw materials are batched and mixed according to the proportion scheme for 30 minutes, and a clarifying agent is added as needed after the raw materials are homogeneously mixed. The mixture is melted in a platinum crucible at 1650° C. for 20 hours, and is then poured into a molding tool for molding. After cooling to 900° C., the resultant is annealed in an annealing furnace at 600° C. for 6 hours, and then is cooled to room temperature in the furnace to obtain the glass precursor. The glass precursor is subjected to nucleation and crystallization successively, so that the transparent spinel glass ceramic can be prepared.

In order to obtain the transparent spinel glass ceramic of the present invention, the nucleation is performed at a nucleation temperature of 700 to 800° C. for a nucleation time period of 30 to 1440 min; and the crystallization is performed at a crystallization temperature of 900 to 1000° C. for a crystallization time period of 5 to 1440 min. The nucleation time herein refers to the holding time after the nucleation furnace is heated to the set nucleation temperature at the set heating rate. The crystallization time herein refers to the holding time after the crystallization furnace is heated to the set nucleation temperature at the set heating rate.

In one embodiment, the glass precursor is introduced into a crystallization furnace, heated up at a heating rate of 5 to 20° C./min to the nucleation temperature, and held for 30 to 1440 minutes to perform the nucleation, so that enough crystal nuclei are formed to ensure the crystallinity of the glass ceramic. After the nucleation is completed, the system is heated up at a heating rate of greater than 20° C./min to the crystallization temperature, and is held for 5 to 1440 minutes to perform the crystallization, so that the required zinc spinel and magnesium spinel are precipitated, and the precipitation of impurity crystal phases is also effectively suppressed. After crystallization, the system is cooled to room temperature in the furnace. By adjusting the heating rate, temperature, and time period in different stages in the process to adapt to the composition of glass ceramics within the above ranges, it can be ensured that impurities that affect the transmittance of spinel glass ceramics will not precipitate, and the glass ceramic does not exhibit phenomena including haze, devitrification and the like.

The nucleation temperature includes the range of 700 to 800° C. and all ranges and subranges therein, e.g., 710 to 790° C., 700 to 720° C., 700 to 730° C., 700 to 740° C., 700 to 750° C., 700 to 760° C., 730 to 800° C., 740 to 800° C., 750 to 800° C., 760 to 800° C. and the like. The nucleation time period includes the range of 30 to 1440 min and all ranges and subranges therein, e.g., 30 to 300 min, 30 to 200 min, 30 to 700 min, 30 to 500 min, 60 to 120 min, 80 to 144 min, 90 to 1200 min, 100 to 1100 min, 300 to 440 min, 100 to 500 min, 200 to 600 min, 300 to 540 min, 100 to 440 min, 300 to 440 min and the like.

The crystallization temperature includes the range of 900 to 1000° C. and all ranges and subranges therein, e.g., 900 to 980° C., 900 to 960° C., 900 to 950° C., 900 to 930° C., 920 to 950° C., 910 to 1000° C., 920 to 1000° C., 930 to 1000° C., 940 to 1000° C. and the like. The crystallization time period includes the range of 5 to 1440 min and all ranges and subranges therein, such as 5 to 100 min, 5 to 150 min, 5 to 200 min, 50 to 300 min, 100 to 440 min, 90 to 340 min, 200 to 1240 min, 800 to 1040 min, 500 to 740 min, 900 to 1040 min, 200 to 340 min, 100 to 300 min, 500 to 1440 min and the like.

In some embodiments, the heating rate during crystallization affects the crystal phase composition in the glass ceramic, ultimately affecting the performance of the glass ceramic products. Different heating rates result in different structures and characteristics of the glass ceramic products. For the glass precursor prepared according to the proportion scheme of the present invention, when the heating rate during crystallization is maintained within the range from 0 to 20° C./min, the glass ceramic is prone to precipitate impurity crystal phases, e.g., a Li-containing crystal phase (e.g., β-spodumene and other crystal phases), quartz, solid solution of quartz, and the like. The inventors found through research that: in the system of spinel microcrystals, the presence of impurity crystal phases such as β quartz, solid solution of β quartz, and β-spodumene will seriously affect the optical properties of spinel glass ceramic materials, such that the crystallized glass ceramic materials will be prone to haze, or even devitrification, resulting in a significant decline in the transmittance of the prepared glass ceramic products. This is not expected in case of a cover glass product. When the heating rate is greater than 20° C./min, preferably greater than or equal to 25° C./min, and more preferably greater than or equal to 30° C./min, Li ions introduced into the glass composition will always remain in the glass phase that is prone to perform ion exchange, and other impurity crystal phases that affect the optical properties of the glass ceramic will not precipitate. Accordingly, the transmittance of the spinel glass ceramic will not be degenerated. See FIGS. 4 and 5 for details.

Figure 4:
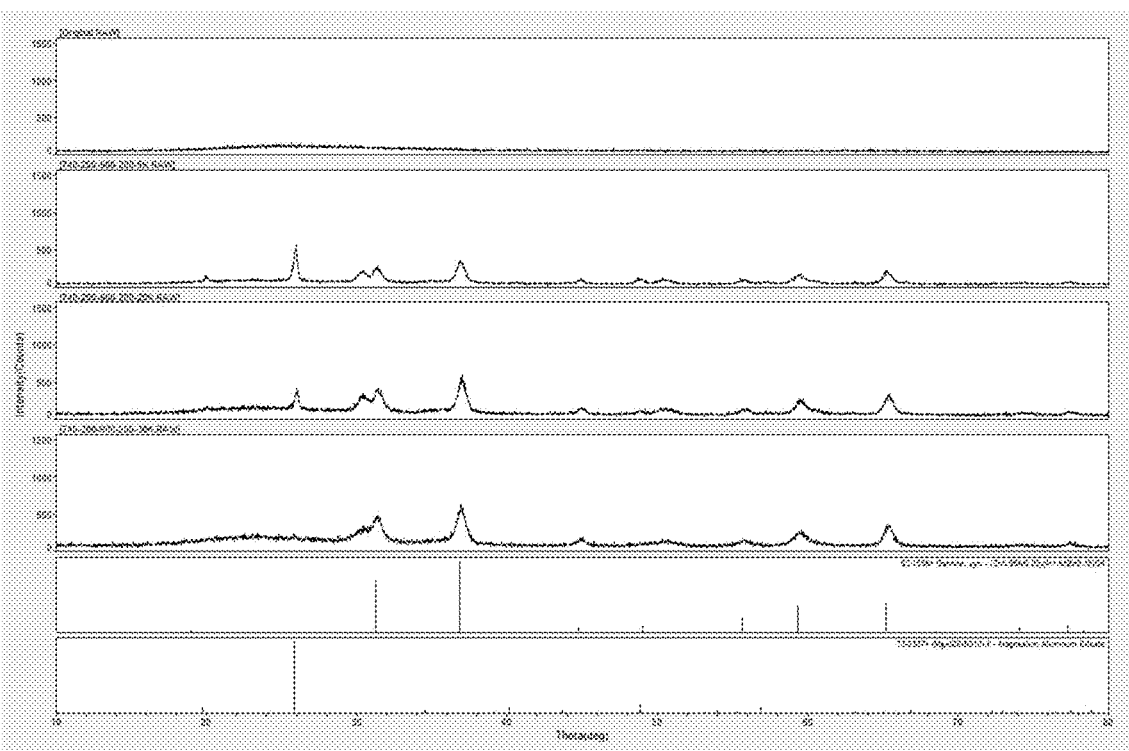
FIG. 4 shows the XRD patterns of glass ceramics prepared by using different heating rates during crystallization.

Referring to FIG. 4, it can be seen that during crystallization, when the heating rate is maintained within the range from 0 to 20° C./min, impurity crystals are precipitated in the glass (there are obvious excess characteristic peaks occurred on the XRD patterns), which mainly comprise crystal phases such as β quartz, solid solution of β quartz, and β-spodumene. As can be seen in combination with FIG. 5, these impurity crystal phases precipitated in the glass seriously affects the optical properties of the glass, resulting in haze and even devitrification of the glass. When the crystallization is carried out at a heating rate of greater than 20° C./min, e.g., at 30° C./min, no impurity crystal precipitated and the glass remains transparent. During the crystallization of the present invention, the heating rate includes the range of greater than 20° C./min and smaller than or equal to 35° C./min and all ranges and subranges therein, e.g., 21 to 30° C./min, 22 to 25° C./min, 25 to 30° C./min, 23 to 28° C./min, 22 to 30° C./min, 23 to 30° C./min, 24 to 30° C./min, 25 to 28° C./min, 21 to 35° C./min and the like. In some embodiments, during the crystallization, the heating rate can be 21° C./min, 22° C./min, 23° C./min, 24° C./min, 25° C./min, 28° C./min, 30° C./min, 35° C./min and the like.

The heating rate during the nucleation process affects the formation and number of crystal nuclei, ultimately affecting the crystallinity and intrinsic strength of the glass ceramic. During the nucleation of the present invention, the heating rate includes the range of 5 to 20° C./min and all ranges and subranges therein, such as 5 to 10° C./min, 10 to 20° C./min, 11 to 20° C./min, 12 to 15° C./min, 9 to 20° C./min, 13 to 20° C./min, 10 to 19° C./min, 9 to 17° C./min and the like. In some embodiments, during the nucleation, the heating rate can be 5° C./min, 9° C./min, 10° C./min, 11° C./min, 12° C./min, 13° C./min, 15° C./min, 16° C./min, 17° C./min, 19° C./min, 20° C./min and the like.

III. The present invention also provides a strengthened glass ceramic. The strengthened glass ceramic of the present invention is prepared from the above transparent spinel glass ceramic by chemically strengthening via ion exchange. The strengthened glass ceramic has a compressive stress zone extending from a surface of the strengthened glass ceramic to a compressive depth. The strengthened glass ceramic comprises a compressive stress layer on the surface and a tensile stress layer inside. The compressive stress layer is a compressive stress zone formed by chemical strengthening, and the tensile stress layer is a zone in which the ion exchange has not occurred. The composition of the tensile stress layer of the strengthened glass ceramic is the same as that of the transparent spinel glass ceramic.

During implementation, the transparent spinel glass ceramic is subjected to a one-step or multi-step ion exchange process in a salt bath to obtain the strengthened glass ceramic.

The above transparent spinel glass ceramic can be chemically strengthened. During the process of chemically strengthening via ion exchange, the glass ceramics will perform $K^+$—$Na^+$ or $Na^+$—$Li^+$ binary ion exchange successively or simultaneously, so that a composite compressive stress layer is obtained in the glass ceramics after ion exchange, and thereby the strengthened glass ceramic has a compressive stress zone extending from a surface of the strengthened glass ceramic to a compressive depth.

By subjecting multiple ion exchange processes to the transparent spinel glass ceramic mentioned above, the performance of the glass ceramic can be enhanced. By using ion exchange salt baths with different ion concentrations, a stress curve is generated at the target depth, so that the obtained strengthened glass ceramics have excellent stress properties.

The crystal phase of the strengthened glass ceramic provided in the present invention comprises spinel crystal and zirconia crystal, and does not comprise a Li-containing crystal as well as quartz or a solid solution of quartz. The spinel crystal comprises zinc spinel and magnesium spinel, and/or a solid solution of zinc spinel ($ZnAl_2O_4$) and magnesium spinel ($MgAl_2O_4$). The glass ceramic has a crystallinity of at least 30.00 wt. %. The average crystal size of the glass ceramic is less than or equal to 15.0 nm. The transmittance of the strengthened glass ceramic with a thickness of 0.7 mm at a light having a wavelength of 550 nm is greater than 85.00%. The depth of compressive stress layer DOL_0 of the strengthened glass ceramic of the present invention is greater than or equal to 14% of the thickness of the strengthened glass ceramic. As the content of $Li_2O$ and $Na_2O$ increases, there are more Na ions and Li ions available for ion exchange in the glass ceramic, which can lead to a higher depth of compressive stress layer.

When the glass ceramic has a thickness of 0.7 mm, DOL_0 is greater than or equal to 100.0 μm, including the range of greater than or equal to 100.0 μm and all ranges and subranges therein, e.g., 100.0 to 125.0 μm, 100.0 to 127.0 μm, 100.0 to 135.0 μm, 100.0 to 140.0 μm, 100.0 to 112.0 μm, 100.0 to 115.0 μm, 100.0 to 116.0 μm, 100.0 to 112.0 μm, 104.0 to 120.0 μm, 106.0 to 111.0 μm, 108.0 to 120.0 μm, 104.0 to 120.0 μm, 108.0 to 120.0 μm and the like. In some embodiments, DOL_0 can be 100.0 μm, 104.0 μm, 106.0 μm, 108.0 μm, 111.0 μm, 112.0 μm, 115.0 μm, 116.0 μm, 120.0 μm, 125.0 μm, 127.0 μm, 135.0 μm, 140.0 μm and the like.

The linear density of center tension CT_LD of the strengthened glass ceramic of the present invention is greater than or equal to 25000 MPa/mm, including the range of greater than or equal to 25000 MPa/mm and all ranges and subranges therein, e.g. 25000 to 40000 MPa/mm, 27000 to 40000 MPa/mm, 25000 to 38000 MPa/mm, 25000 to 37000 MPa/mm, 25000 to 39000 MPa/mm, 27000 to 38000 MPa/mm, 27000 to 39000 MPa/mm, 28000 to 38000 MPa/mm and the like. In some embodiments, CT_LD can be 25000 MPa/mm, 27000 MPa/mm, 28000 MPa/mm, 37000 MPa/mm, 38000 MPa/mm, 39000 MPa/mm, 40000 MPa/mm and the like.

The surface compressive stress CS of the strengthened glass ceramic of the present invention is greater than or equal to 650 MPa, including the range of greater than or equal to 650 MPa and all ranges and subranges therein, e.g., preferably greater than or equal to 680 MPa, preferably greater than or equal to 700 MPa, preferably greater than or equal to 750 MPa, preferably greater than or equal to 800 MPa, preferably greater than or equal to 900 MPa, preferably greater than or equal to 1000 MPa, preferably 700 to 800 MPa, preferably 750 to 800 MPa, preferably 760 to 870 MPa, preferably 710 to 860 MPa, preferably 700 to 900 MPa, preferably 800 to 1000 MPa, preferably 850 to 1000 MPa and the like. In some embodiments, CS can be 650 MPa, 680 MPa, 700 MPa, 710 MPa, 750 MPa, 760 MPa, 800 MPa, 850 MPa, 860 MPa, 870 MPa, 900 MPa, 1000 MPa and the like.

The average center tension CT_AV of the strengthened glass ceramic of the present invention is greater than or equal to 35.0 MPa, including the range of greater than or equal to 35.0 MPa and all ranges and subranges therein, e.g., preferably greater than or equal to 39.0 MPa, preferably greater than or equal to 40.0 MPa, preferably greater than or equal to 45.0 MPa, preferably greater than or equal to 50.0 MPa, preferably greater than or equal to 55.0 MPa, preferably greater than or equal to 60.0 MPa, preferably greater than or equal to 65.0 MPa, preferably greater than or equal to 70.0 MPa, preferably greater than or equal to 75.0 MPa, preferably 39.0 MPa to 65.0 MPa, preferably 35.0 MPa to 65.0 MPa, preferably 35.0 MPa to 55.0 MPa, preferably 35.0 MPa to 70.0 MPa and the like. In some embodiments, CT_AV can be 35.0 MPa, 39.0 MPa, 40.0 MPa, 45.0 MPa, 50.0 MPa, 55.0 MPa, 60.0 MPa, 65.0 MPa, 70.0 MPa, 75.0 MPa and the like.

The Vickers hardness of the strengthened glass ceramic of the present invention is greater than or equal to 740HV0.3, wherein 740 refers to the Vickers hardness, and 0.3 refers to the load used for measurement is 0.3 kg. The Vickers hardness of the strengthened glass ceramic of the present invention includes the range of greater than or equal to 740HV0.3 and all ranges and subranges therein, e.g., preferably greater than or equal to 760HV0.3, preferably greater than or equal to 770HV0.3, preferably greater than or equal to 780HV0.3, preferably greater than or equal to 790HV0.3, preferably greater than or equal to 800HV0.3, preferably greater than or equal to 820HV0.3, preferably greater than or equal to 830HV0.3, preferably 740HV0.3 to 780HV0.3, preferably 740HV0.3 to 830HV0.3 and the like. In some embodiments, the Vickers hardness can be 740HV0.3, 760HV0.3, 770HV0.3, 780HV0.3, 790HV0.3, 800HV0.3, 820HV0.3, 830HV0.3 and the like.

The fracture toughness of the strengthened glass ceramic of the present invention is greater than or equal to 1.500 MPa·m$^{1/2}$, including the range of greater than or equal to 1.500 MPa·m$^{1/2}$ and all ranges and subranges therein, e.g., preferably greater than or equal to 1.560 MPa·m$^{1/2}$, preferably 1.500 to 1.560 MPa·m$^{1/2}$, preferably 1.600 to 1.700 MPa·m$^{1/2}$, preferably 1.500 to 1.590 MPa·m$^{1/2}$, preferably 1.540 to 1.600 MPa·m$^{1/2}$, preferably 1.500 to 1.610 MPa·m$^{1/2}$, preferably 1.500 to 1.630 MPa·m$^{1/2}$, preferably 1.500 to 1.700 MPa·m$^{1/2}$ and the like. In some embodiments, the fracture toughness of the strengthened glass ceramic can be 1.500 MPa·m$^{1/2}$, 1.540 MPa·m$^{1/2}$, 1.560 MPa·m$^{1/2}$, 1.590 MPa·m$^{1/2}$, 1.600 MPa·m$^{1/2}$, 1.610 MPa·m$^{1/2}$, 1.630 MPa·m$^{1/2}$, 1.700 MPa·m$^{1/2}$, and the like.

In the present invention, the strengthened glass ceramic product with better performances can be obtained after ion exchange, regardless of whether one or multiple ion exchanges are performed on the transparent spinel glass ceramic, because the intrinsic strength of the glass ceramic has already been enhanced.

The salt bath used in the present invention includes at least one of potassium salt and sodium salt. Nitrate is conventional type of salt to be used for ion exchange, but any suitable salts or combinations thereof can also be used.

During an one-step ion exchange, the salt bath comprises: 50 to 100 wt. % NaNO$_3$+0 to 50 wt. % KNO$_3$, and the ion exchange temperature is 400 to 500° C., and the ion exchange time is 0.5 to 48 hours. The "ion exchange time" herein refers to the time period during which the glass ceramics are kept in a salt bath having the specified temperature and composition for chemical strengthening.

In one embodiment, the ion exchange temperature includes the range of 400 to 500° C. and all ranges and subranges therein, e.g., 400 to 500° C., 400 to 410° C., 400 to 420° C., 400 to 430° C., 400 to 440° C., 400 to 450° C., 400 to 460° C., 400 to 470° C., 410 to 450° C., 430 to 500° C., 440 to 500° C. and the like. In one embodiment, the ion exchange time includes the range of 0.5 to 48 h and all ranges and subranges therein, e.g., 0.5 to 46 h, 1 to 10 h, 1 to 5 h, 1 to 40 h, 7 to 30 h, 9 to 29 h, 10 to 41 h, 6 to 32 h, 9 to 27 h, 4 to 33 h, 5 to 27 h, 6 to 38 h and the like.

The salt bath comprises 50 to 100 wt. % of NaNO$_3$ and all ranges and subranges therein, e.g., 50 to 60 wt. %, 50 to 70 wt. %, 50 to 80 wt. %, 50 to 90 wt. %, 60 to 100 wt. %, 70 to 100 wt. %, 80 to 100 wt. %, 50 to 89 wt. %, 64 to 88 wt. %, 90 to 100 wt. % and the like; and 0 to 50 wt. % of KNO$_3$ and all ranges and subranges therein, e.g., 0 to 40 wt. %, 0 to 30 wt. %, 0 to 20 wt. %, 0 to 10 wt. %, 0 to 14 wt. %, 0 to 15 wt. %, 0 to 35 wt. %, 0 to 45 wt. %, 5 to 40 wt. %, 20 to 30 wt. % and the like.

During a two-step ion exchange, in the first step, the salt bath comprises: 90 to 100 wt. % NaNO$_3$+0 to 10 wt. % KNO$_3$, and the ion exchange temperature is 400 to 500° C., and the ion exchange time is 0.5 to 48 hours; and in the second step, the salt bath composition comprises: 0 to 10 wt. % NaNO$_3$+90 to 100 wt. % KNO$_3$, and the ion exchange temperature is 400 to 500° C., and the ion exchange time is 0.5 to 48 hours.

In one embodiment, the ion exchange temperature includes the range of 400 to 500° C. and all ranges and subranges therein, e.g., 400 to 500° C., 400 to 410° C., 400 to 420° C., 400 to 430° C., 400 to 440° C., 400 to 450° C., 400 to 460° C., 400 to 470° C., 410 to 450° C., 430 to 500° C., 440 to 500° C. and the like. In one embodiment, the ion exchange time includes the range of 0.5 to 48 h and all ranges and subranges therein, e.g., 0.5 to 46 h, 1 to 10 h, 1 to 5 h, 1 to 40 h, 7 to 30 h, 9 to 29 h, 10 to 41 h, 6 to 32 h, 9 to 27 h, 4 to 33 h, 5 to 27 h, 6 to 38 h and the like.

The salt bath in the first step comprises 90 to 100 wt. % of NaNO$_3$ and all ranges and subranges therein, e.g., 91 to 100 wt. %, 92 to 100 wt. %, 93 to 100 wt. %, 94 to 100 wt. %, 95 to 100 wt. %, 96 to 100 wt. %, 97 to 100 wt. %, 98 to 100 wt. %, 99 to 100 wt. % and the like; and further comprises 0 to 10 wt. % of KNO$_3$ and all ranges and subranges therein, e.g., 0 to 1 wt. %, 0 to 2 wt. %, 0 to 3 wt. %, 0 to 4 wt. %, 5 to 10 wt. %, 2 to 10 wt. %, 6 to 9 wt. %, 3 to 8 wt. %, 2 to 9 wt. %, 1 to 8 wt. % and the like.

The salt bath in the second step comprises 0 to 10 wt. % of NaNO$_3$ and all ranges and subranges therein, e.g., 0 to 1 wt. %, 0 to 2 wt. %, 0 to 3 wt. %, 0 to 4 wt. %, 2 to 10 wt. %, 3 to 5 wt. %, 5 to 10 wt. %, 6 to 10 wt. %, 2 to 7 wt. %, 3 to 7 wt. % and the like; and further comprises 90 to 100 wt. % of KNO$_3$ and all ranges and subranges therein, e.g., 91 to 100 wt. %, 92 to 100 wt. %, 93 to 100 wt. %, 94 to 100 wt. %, 95 to 100 wt. %, 96 to 100 wt. %, 97 to 100 wt. %, 98 to 100 wt. % and the like.

In order to improve the service life of the salt bath, a salt bath protector can be added to the salt bath with a mass percentage of 0.1 to 5 wt. % based on the total weight of the salt bath. The salt bath protector comprises substances used for passivation, precipitation, or absorption of Lit. For example, phosphates, silicates, carbonates, and the like, that are able to passivate, precipitate, or absorb Lit can be used as the salt bath protector, to avoid affecting the ion exchange performance and service life of the salt bath due to the increased concentration of Lit exchanged in the salt bath. The amount of the salt bath protector comprises the range of 0.1 to 5.0 wt. % and all ranges and subranges therein, e.g., 0.1 to 4.0 wt. %, 0.1 to 3.0 wt. %, 0.1 to 2.0 wt. %, 0.1 to 1.0 wt. %, 0.2 to 5.0 wt. %, 0.5 to 5.0 wt. %, 4.1 to 5.0 wt. %, 3.1 to 5.0 wt. %, 2.6 to 4.5 wt. %, 0.7 to 3.5 wt. %, 0.8 to 2.5 wt. %, 0.9 to 1.5 wt. %, 0.8 to 2.5 wt. % and the like.

IV. The present invention also provides an electronic terminal used as an consumer product. The electronic terminal comprises:

a housing comprising a front surface, a back surface, and a side surface; and an electronic assembly partially located in the housing, the electronic assembly comprising a display device located on or adjacent to the front surface of the housing; and wherein the front surface and/or the back surface and/or the side surface comprises the strengthened glass ceramic material.

The electronic terminal may further comprise a covering product configured to cover the front surface of the housing or dispose on the display device, wherein the covering product comprises the strengthened glass ceramic material.

The electronic terminal as a consumer product includes mobile phones, tablet computers, photovoltaic devices, or other electronic terminals (e.g., electronic watches).

Both the transparent spinel glass ceramic and the strengthened glass ceramic of the present invention have excellent performances, and can be contained in/applied to other article of manufactures such as watches, transparent armors, guide missile windows, fairings, substrate materials, new lamps and lanterns, observation windows for equipment used in high-temperature, high-pressure and corrosive environments, display protection materials and exterior housing protection materials for portable intelligent electronic devices (portable intelligent electronic devices including mobile phones, tablet computers, electronic watches, etc.), building products, transportation products (e.g., automobiles, trains, aircrafts, marine vehicles, etc.), utensil products, or any products that require a certain degree of transparency, scratch resistance, impact resistance, wear resistance, or any combinations thereof.

V. The present invention will be further described in details below by specific examples.

TABLE 1

Glass ceramic proportion schemes of Schemes 1-6 in the present invention

| Basic Glass Composition (mol. %) | Scheme 1 | Scheme 2 | Scheme 3 | Scheme 4 | Scheme 5 | Scheme 6 |
|---|---|---|---|---|---|---|
| $SiO_2$ | 52.03 | 51.76 | 51.54 | 56.74 | 56.33 | 56.03 |
| $Al_2O_3$ | 18.60 | 18.50 | 18.43 | 16.50 | 16.38 | 16.29 |
| $TiO_2$ | 0.88 | 0.88 | 0.87 | 1.01 | 1.00 | 1.00 |
| $ZrO_2$ | 3.02 | 3.00 | 2.99 | 3.50 | 3.47 | 3.46 |
| MgO | 7.56 | 7.52 | 7.49 | 6.00 | 5.96 | 5.93 |
| ZnO | 9.66 | 9.61 | 9.57 | 9.21 | 9.14 | 9.10 |
| $Na_2O$ | 3.31 | 3.29 | 3.28 | 2.41 | 2.39 | 2.38 |
| $Li_2O$ | 3.80 | 4.30 | 4.70 | 3.50 | 4.20 | 4.70 |
| BaO | 1.14 | 1.14 | 1.13 | 1.13 | 1.13 | 1.11 |

TABLE 2

Glass ceramic proportion schemes of Schemes 7-12 in the present invention

| Basic Glass Composition (mol. %) | Scheme 7 | Scheme 8 | Scheme 9 | Scheme 10 | Scheme 11 | Scheme 12 |
|---|---|---|---|---|---|---|
| $SiO_2$ | 62.60 | 62.34 | 61.88 | 51.13 | 50.81 | 50.49 |
| $Al_2O_3$ | 15.05 | 14.99 | 14.88 | 15.80 | 15.70 | 15.60 |
| $TiO_2$ | 0.32 | 0.32 | 0.32 | 1.22 | 1.21 | 1.20 |
| $ZrO_2$ | 3.02 | 3.01 | 2.99 | 4.07 | 4.04 | 4.02 |
| MgO | 4.03 | 4.01 | 3.98 | 4.10 | 4.07 | 4.05 |
| ZnO | 8.13 | 8.10 | 8.04 | 15.20 | 15.11 | 15.01 |
| $Na_2O$ | 3.05 | 3.03 | 3.01 | 3.55 | 3.54 | 3.52 |
| $Li_2O$ | 3.80 | 4.20 | 4.90 | 3.60 | 4.20 | 4.80 |
| BaO | 0.00 | 0.00 | 0.00 | 1.33 | 1.32 | 1.31 |

TABLE 3

Glass ceramic proportion schemes of Comparative Schemes 13-16 in the present invention

| Basic Glass Composition (mol. %) | Comparative Scheme 13 | Comparative Scheme 14 | Comparative Scheme 15 | Comparative Scheme 16 |
|---|---|---|---|---|
| $SiO_2$ | 53.94 | 54.44 | 51.02 | 59.25 |
| $Al_2O_3$ | 19.50 | 19.50 | 22.01 | 15.33 |
| $TiO_2$ | 0.89 | 0.89 | 0.88 | 0.79 |
| $ZrO_2$ | 3.02 | 3.02 | 3.53 | 3.01 |
| MgO | 5.67 | 5.67 | 5.12 | 5.02 |
| ZnO | 9.86 | 9.86 | 10.26 | 9.22 |
| $Na_2O$ | 3.45 | 3.45 | 3.02 | 3.22 |
| $Li_2O$ | 2.50 | 2.00 | 3.00 | 3.00 |
| BaO | 1.17 | 1.17 | 1.16 | 1.16 |

TABLE 4

Properties of the glass ceramics and the corresponding strengthened glass
ceramics prepared in Examples 1 to 2 and Comparative Examples 13 to 16

| Condition | Comparative Example 13 | Comparative Example 14 | Comparative Example 15 | Comparative Example 16 | Example 1 | Example 2 |
|---|---|---|---|---|---|---|
| Proportion Scheme | Comparative Scheme 13 | Comparative Scheme 14 | Comparative Scheme 15 | Comparative Scheme 16 | Scheme 1 | Scheme 2 |
| Nucleation Temperature (° C.)/ Time (min) | 755/200 | 750/200 | 750/200 | 770/200 | 740/200 | 730/200 |
| Crystallization Temperature (° C.)/ Time (min) | 930/100 | 920/100 | 910/100 | 920/100 | 900/100 | 900/100 |
| Nucleation Heating Rate (° C./min) | 10 | 10 | 10 | 10 | 10 | 10 |
| Crystallization Heating Rate (° C./min) | 10 | 10 | 10 | 10 | 25 | 30 |
| Crystal Phase A | $ZnAl_2O_4$ | $ZnAl_2O_4$ | $ZnAl_2O_4$ | $ZnAl_2O_4$ | $ZnAl_2O_4$ | $ZnAl_2O_4$ |
| Crystal Phase B | $MgAl_2O_4$ | $MgAl_2O_4$ | $MgAl_2O_4$ | $MgAl_2O_4$ | $MgAl_2O_4$ | $MgAl_2O_4$ |
| Crystal Phase C | $ZrO_2$ | $ZrO_2$ | $ZrO_2$ | $ZrO_2$ | $ZrO_2$ | $ZrO_2$ |
| Average Crystal Size/nm | 9.8 | 9.5 | 10.2 | 9.8 | 11.5 | 10.3 |
| Crystallinity/wt. %, MDI Jade 6 Fitting & Calculation | 42.70% | 43.90% | 45.50% | 35.60% | 37.40% | 38.60% |
| Minimum transmittance (%) at 360 nm | 71.90% | 71.90% | 73.60% | 73.50% | 72.13% | 72.10% |
| Transmittance (%) at 550 nm | 87.50% | 87.50% | 87.90% | 87.50% | 86.80% | 87.60% |
| Transmittance (%) at 589 nm | 91.01% | 91.01% | 91.15% | 90.52% | 90.20% | 89.90% |
| Refractivity (@589 nm, Abbe Refractometer) | 1.583 | 1.581 | 1.583 | 1.579 | 1.593 | 1.589 |
| First Strengthening Salt/Configuration | 100% $NaNO_3$ 450-3H | 100% $NaNO_3$ 450-3H | 100% $NaNO_3$ 450-3H | 100% $NaNO_3$ 450-3H | 100% $NaNO_3$ 450-3H | 100% $NaNO_3$ 450-3H |
| CT_AV | 28.7 | 24.5 | 34.8 | 35.9 | 41.8 | 52.3 |
| DOL_0 (μm) | 89 | 78 | 107 | 109 | 115 | 124.5 |
| CT_LD | 21402 | 19040 | 24161 | 24720 | 28066 | 33696 |
| Second Strengthening Salt/ Configuration | 100% $KNO_3$ 450-3H | 100% $KNO_3$ 450-3H | 100% $KNO_3$ 450-3H | 100% $KNO_3$ 450-3H | 100% $KNO_3$ 450-1H | 100% $KNO_3$ 450-1H |
| CS/MPa | 830 | 802 | 840 | 855 | 872 | 842 |
| DOL_2 (μm) | 6.252 | 5.465 | 6.113 | 5.964 | 6.241 | 5.879 |
| Vickers Hardness of Strengthened Glass Ceramic (HV) | 759 | 721 | 754 | 742 | 795 | 811 |
| Drop Resistance Height of Strengthened Glass Ceramic (m) | 1.21 | 1.02 | 1.31 | 1.33 | 1.43 | 1.62 |
| Fracture Toughness of Strengthened Glass Ceramic ($MPa \cdot m^{1/2}$) | 1.594 | 1.542 | 1.59 | 1.587 | 1.598 | 1.612 |

Note:

DOL_0 is the depth of compressive stress layer generated by the exchange of Li ions in the glass ceramic with Na ions in the salt bath.

DOL_2 is the depth of compressive stress layer generated by the exchange of Na ions in the glass ceramic with K ions in the salt bath.

"450-3H" refers to an ion exchange temperature of 450° C. and an ion exchange time of 3 hours, and other similar expressions have similar meanings.

"100% $NaNO_3$" refers to 100 wt. % $NaNO_3$, and other similar expressions have similar meanings.

TABLE 5

Properties of the glass ceramics and the corresponding
strengthened glass ceramics prepared in Examples 3 to 7

| Condition | Example 3 | Example 4 | Example 5 | Example 6 | Example 7 |
|---|---|---|---|---|---|
| Proportion Scheme | Scheme 3 | Scheme 4 | Scheme 5 | Scheme 6 | Scheme 7 |
| Nucleation Temperature (° C.)/Time (min) | 720/200 | 760/200 | 755/200 | 745/200 | 785/200 |
| Crystallization Temperature (° C.)/Time (min) | 900/100 | 900/100 | 900/100 | 900/100 | 900/100 |
| Nucleation Heating Rate (° C./min) | 10 | 10 | 10 | 10 | 10 |
| Crystallization Heating Rate (° C./min) | 35 | 30 | 35 | 30 | 30 |
| Crystal Phase A | $ZnAl_2O_4$ | $ZnAl_2O_4$ | $ZnAl_2O_4$ | $ZnAl_2O_4$ | $ZnAl_2O_4$ |
| Crystal Phase B | $MgAl_2O_4$ | $MgAl_2O_4$ | $MgAl_2O_4$ | $MgAl_2O_4$ | $MgAl_2O_4$ |
| Crystal Phase C | $ZrO_2$ | $ZrO_2$ | $ZrO_2$ | $ZrO_2$ | $ZrO_2$ |
| Average Crystal Size/nm | 10.7 | 10.3 | 9.9 | 11.7 | 8.8 |
| Crystallinity/wt. %, MDI Jade 6 Fitting & Calculation | 37.50% | 34.10% | 33.80% | 34.70% | 31.20% |
| Minimum transmittance (%) at 360 nm | 71.83% | 71.54% | 72.14% | 71.89% | 78.11% |
| Transmittance (%) at 550 nm | 88.50% | 88.51% | 88.61% | 89.11% | 90.05% |
| Transmittance (%) at 589 nm | 90.10% | 89.69% | 90.21% | 90.51% | 90.88% |
| Refractivity (@589 nm, Abbe Refractometer) | 1.583 | 1.591 | 1.589 | 1.583 | 1.578 |
| First Strengthening Salt/ Configuration | 100% $NaNO_3$ 450-3H | 100% $NaNO_3$ 450-3H | 100% $NaNO_3$ 450-3H | 100% $NaNO_3$ 450-3H | 100% $NaNO_3$ 450-3H |
| CT_AV | 61.2 | 40.5 | 49.5 | 59.8 | 39.8 |
| DOL_0 (µm) | 132.2 | 109.8 | 118.3 | 127.2 | 101.7 |
| CT LD | 38084 | 27795 | 32769 | 38067 | 28235 |
| Second Strengthening Salt/ Configuration | 100% $KNO_3$ 450-1H | 100% $KNO_3$ 450-1H | 100% $KNO_3$ 450-1H | 100% $KNO_3$ 450-1H | 100% $KNO_3$ 450-1H |
| CS/MPa | 877 | 688 | 704 | 692 | 795 |
| DOL_2 (µm) | 6.322 | 5.879 | 6.023 | 6.114 | 5.941 |
| Vickers Hardness of Strengthened Glass Ceramic (HV) | 809 | 756 | 759 | 747 | 788 |
| Drop Resistance Height of Strengthened Glass Ceramic (m) | 2.02 | 1.41 | 1.61 | 1.69 | 1.43 |
| Fracture Toughness of Strengthened Glass Ceramic ($MPa \cdot m^{1/2}$) | 1.605 | 1.569 | 1.572 | 1.562 | 1.598 |

Note:
DOL_0 is the depth of compressive stress layer generated by the exchange of Li ions in the glass ceramic with Na ions in the salt bath.
DOL_2 is the depth of compressive stress layer generated by the exchange of Na ions in the glass ceramic with K ions in the salt bath.
"450-3H" refers to an ion exchange temperature of 450° C. and an ion exchange time of 3 hours, and other similar expressions have similar meanings.
"100% $NaNO_3$" refers to 100 wt. % $NaNO_3$, and other similar expressions have similar meanings.

TABLE 6

Properties of the glass ceramics and the corresponding strengthened
glass ceramics prepared in Examples 8 to 12

| Condition | Example 8 | Example 9 | Example 10 | Example 11 | Example 12 |
|---|---|---|---|---|---|
| Proportion Scheme | Scheme 8 | Scheme 9 | Scheme 10 | Scheme 11 | Scheme 12 |
| Nucleation Temperature (° C.)/Time (min) | 780/200 | 760/200 | 740/200 | 730/200 | 720/200 |
| Crystallization Temperature (° C.)/Time (min) | 900/100 | 900/100 | 900/100 | 900/100 | 900/100 |
| Nucleation Heating Rate (° C./min) | 10 | 10 | 10 | 10 | 10 |
| Crystallization Heating Rate (° C./min) | 30 | 30 | 30 | 35 | 30 |
| Crystal Phase A | $ZnAl_2O_4$ | $ZnAl_2O_4$ | $ZnAl_2O_4$ | $ZnAl_2O_4$ | $ZnAl_2O_4$ |
| Crystal Phase B | $MgAl_2O_4$ | $MgAl_2O_4$ | $MgAl_2O_4$ | $MgAl_2O_4$ | $MgAl_2O_4$ |
| Crystal Phase C | $ZrO_2$ | $ZrO_2$ | $ZrO_2$ | $ZrO_2$ | $ZrO_2$ |
| Average Crystal Size/nm | 9.0 | 10.2 | 10.2 | 9.5 | 9.8 |
| Crystallinity/wt. %, MDI Jade 6 Fitting & Calculation | 32.50% | 30.40% | 36.50% | 37.20% | 37.60% |
| Minimum transmittance (%) at 360 nm | 78.16% | 77.13% | 71.87% | 70.25% | 70.14% |

TABLE 6-continued

Properties of the glass ceramics and the corresponding strengthened
glass ceramics prepared in Examples 8 to 12

| Condition | Example 8 | Example 9 | Example 10 | Example 11 | Example 12 |
|---|---|---|---|---|---|
| Transmittance (%) at 550 nm | 89.72% | 89.81% | 88.21% | 87.81% | 87.55% |
| Transmittance (%) at 589 nm | 90.32% | 90.22% | 89.25% | 88.20% | 88.11% |
| Refractivity (@589 nm, Abbe Refractometer) | 1.572 | 1.568 | 1.599 | 1.592 | 1.587 |
| First Strengthening Salt/ Configuration | 100% NaNO$_3$ 450-3H | 100% NaNO$_3$ 450-3H | 100% NaNO$_3$ 450-3H | 100% NaNO$_3$ 450-3H | 100% NaNO$_3$ 450-3H |
| CT_AV | 48.5 | 57.6 | 45.7 | 57.8 | 65.3 |
| DOL_0 (μm) | 115.3 | 127.6 | 105.5 | 128.3 | 139.5 |
| CT_LD | 32523 | 36601 | 31925 | 36612 | 39273 |
| Second Strengthening Salt/ Configuration | 100% KNO$_3$ 450-1H | 100% KNO$_3$ 450-1H | 100% KNO$_3$ 450-1H | 100% KNO$_3$ 450-1H | 100% KNO$_3$ 450-1H |
| CS/MPa | 785 | 791 | 901 | 932 | 925 |
| DOL_2 (μm) | 6.012 | 5.879 | 6.842 | 5.672 | 5.864 |
| Vickers Hardness of Strengthened Glass Ceramic (HV) | 775 | 765 | 801 | 828 | 818 |
| Drop Resistance Height of Strengthened Glass Ceramic (m) | 1.60 | 1.79 | 1.60 | 1.86 | 2.26 |
| Fracture Toughness of Strengthened Glass Ceramic (MPa · m$^{1/2}$) | 1.591 | 1.589 | 1.598 | 1.612 | 1.613 |

Note:

DOL_0 is the depth of compressive stress generated by the exchange of Li ions in the glass ceramic with Na ions in the salt bath.

DOL_2 is the depth of compressive stress generated by the exchange of Na ions in the glass ceramic with K ions in the salt bath.

"450-3H" refers to an ion exchange temperature of 450° C. and an ion exchange time of 3 hours, and other similar expressions have similar meanings.

"100% NaNO3" refers to 100 wt. % NaNO3, and other similar expressions have similar meanings.

TABLE 7

Glass ceramics prepared in Comparative Examples 1 to 6

| Condition | Comparative Example 1 | Comparative Example 2 | Comparative Example 3 | Comparative Example 4 | Comparative Example 5 | Comparative Example 6 |
|---|---|---|---|---|---|---|
| Proportion Scheme | Scheme 1 | Scheme 2 | Scheme 3 | Scheme 4 | Scheme 5 | Scheme 6 |
| Nucleation Temperature (° C.)/Time (min) | 740/200 | 730/200 | 720/200 | 760/200 | 755/200 | 745/200 |
| Crystallization Temperature (° C.)/Time (min) | 900/100 | 900/100 | 900/100 | 900/100 | 900/100 | 900/100 |
| Nucleation Heating Rate (° C./min) | 10 | 10 | 10 | 10 | 10 | 10 |
| Crystallization Heating Rate (° C./min) | 10 | 10 | 10 | 15 | 10 | 10 |
| Crystal Phase A | ZnAl$_2$O$_4$ | ZnAl$_2$O$_4$ | ZnAl$_2$O$_4$ | ZnAl$_2$O$_4$ | ZnAl$_2$O$_4$ | ZnAl$_2$O$_4$ |
| Crystal Phase B | MgAl$_2$O$_4$ | MgAl$_2$O$_4$ | MgAl$_2$O$_4$ | MgAl$_2$O$_4$ | MgAl$_2$O$_4$ | MgAl$_2$O$_4$ |
| Crystal Phase C | ZrO$_2$ | ZrO$_2$ | ZrO$_2$ | ZrO$_2$ | ZrO$_2$ | ZrO$_2$ |
| Crystal Phase D | Quartz solid solution | Quartz solid solution | Quartz solid solution | Quartz solid solution | Quartz solid solution | Quartz solid solution |
| Average Crystal Size/nm | 20.5 | 21.5 | 23.5 | 19.8 | 21.5 | 28.7 |
| Crystallinity/wt. %, MDI Jade 6 Fitting & Calculation | 44.70% | 50.60% | 52.40% | 43.50% | 53.90% | 61.50% |
| Minimum transmittance (%) at 360 nm | 21.30% | 19.40% | 18.60% | 23.80% | 20.75% | 19.31% |
| Transmittance (%) at 550 nm | 45.40% | 45.50% | 41.80% | 46.10% | 44.61% | 43.81% |

TABLE 7-continued

| | Glass ceramics prepared in Comparative Examples 1 to 6 | | | | | |
|---|---|---|---|---|---|---|
| Condition | Comparative Example 1 | Comparative Example 2 | Comparative Example 3 | Comparative Example 4 | Comparative Example 5 | Comparative Example 6 |
| Transmittance (%) at 589 nm | 50.53% | 47.30% | 49.90% | 52.33% | 51.13% | 49.89% |
| Refractivity (@589 nm, Abbe Refractometer) | Untestable | Untestable | Untestable | Untestable | Untestable | Untestable |

Note:
The quartz solid solutions precipitated in the above Comparative Examples are mainly solid solution of β quartz.

TABLE 8

| | Glass ceramics prepared in Comparative Examples 7 to 12 | | | | | |
|---|---|---|---|---|---|---|
| Condition | Comparative Example 7 | Comparative Example 8 | Comparative Example 9 | Comparative Example 10 | Comparative Example 11 | Comparative Example 12 |
| Proportion Scheme | Scheme 7 | Scheme 8 | Scheme 9 | Scheme 10 | Scheme 11 | Scheme 12 |
| Nucleation Temperature (° C.)/Time (min) | 785/200 | 780/200 | 760/200 | 740/200 | 730/200 | 720/200 |
| Crystallization Temperature (° C.)/Time (min) | 900/100 | 900/100 | 900/100 | 900/100 | 900/100 | 900/100 |
| Nucleation Heating Rate (° C./min) | 10 | 10 | 10 | 10 | 10 | 10 |
| Crystallization Heating Rate (° C./min) | 10 | 5 | 10 | 10 | 5 | 10 |
| Crystal Phase A | $ZnAl_2O_4$ | $ZnAl_2O_4$ | $ZnAl_2O_4$ | $ZnAl_2O_4$ | $ZnAl_2O_4$ | $ZnAl_2O_4$ |
| Crystal Phase B | $MgAl_2O_4$ | $MgAl_2O_4$ | $MgAl_2O_4$ | $MgAl_2O_4$ | $MgAl_2O_4$ | $MgAl_2O_4$ |
| Crystal Phase C | $ZrO_2$ | $ZrO_2$ | $ZrO_2$ | $ZrO_2$ | $ZrO_2$ | $ZrO_2$ |
| Crystal Phase D | Quartz solid solution | Quartz solid solution | Quartz solid solution | Quartz solid solution | Quartz solid solution | Quartz solid solution |
| Average Crystal Size/nm | 23.2 | 31.4 | 30.5 | 19.9 | 21.4 | 23.5 |
| Crystallinity/wt. %, MDI Jade 6 Fitting & Calculation | 48.70% | 62.43% | 61.30% | 45.20% | 61.32% | 62.30% |
| Minimum transmittance (%) at 360 nm | 25.31% | 20.85% | 21.01% | 20.31% | 17.57% | 14.30% |
| Transmittance (%) at 550 nm | 54.63% | 43.24% | 48.27% | 44.48% | 39.84% | 28.49% |
| Transmittance (%) at 589 nm | 60.85% | 46.68% | 53.54% | 51.53% | 45.73% | 32.55% |
| Refractivity (@589 nm, Abbe Refractometer) | Untestable | Untestable | Untestable | Untestable | Untestable | Untestable |

Note:
The quartz solid solutions precipitated in the above Comparative Examples are mainly solid solution of β quartz.

Taking Example 1 as an example, the ingredients with a total amount of 1000 g were batched and mixed according to proportion scheme of Scheme 1 for 30 minutes. After mixing, 5 g of clarifying agent (NaCl) was added and the mixture was melted in a platinum crucible at 1650° C. for 20 hours, and was then poured into a molding tool for molding. After being cooled to 900° C., the resultant was annealed in a 600° C. annealing furnace for 6 hours, and was then cooled to room temperature in the furnace to obtain a glass precursor. According to the corresponding process conditions in the above tables, the glass precursor was subjected to nucleation and crystallization successively to produce a glass ceramic. According to the corresponding strengthening process conditions in the above tables, the glass ceramic was chemically strengthened to produce the strengthened glass ceramic.

Based on Tables 1 to 6, it can be seen that due to the lower contents of $Li_2O$ and $Na_2O$ in glass proportion schemes of Comparative Examples 13 to 16 as compared to Examples 1 to 12, the CT_LD of the strengthened glass ceramics obtained is much lower than that from Examples 1 to 12, and even may not reach 20000 MPa/mm. The drop resistance height of the strengthened glass ceramic prepared from the glass ceramics of Examples 1 to 12 are significantly superior than that of Comparative Examples 13 to 16.

The strengthened glass ceramics of Comparative Examples 13 and 15 and Examples 5, 6, 11 and 12 were subjected to the drop test of complete machine. 10 pieces of each sample were tested. The test results are shown in FIG. 1. It can be seen from FIG. 1 that Comparative Example 13 and Comparative Example 15 showed poor performances in the drop test, and the drop height is distributed mainly between 0.7 and 1.7 m. For Examples 5, 6, 11 and 12, due to high $Li_2O$ content in the proportion scheme, the linear density of center tension CT_LD after strengthening is significantly increased, the depth of compressive layer DOL_0 is also significantly increased, such that the drop height thereof are significantly increased. Meanwhile, the CT_LD of Example 12 is equivalent to Example 6, and Example 12 which has a higher crystallinity showed a significantly higher drop height, in which only 2 out of the 10 dropped glass pieces have a drop height of less than 2 m. It can be seen that in the strengthened glass ceramic, the drop height is related to both crystallinity and CT_LD. In the present invention, by adding more $Li_2O$ while also maintaining crystallinity, high CT_LD and good drop resistant effect after strengthening are achieved.

As can be seen from Tables 7 to 8, the heating rate during crystallization has a significant impact on the crystal phase type of the glass ceramic. In Comparative Examples 1 to 12, the heating rate for crystallization is less than 20° C./min, and an impurity crystal phase, namely, solid solution of quartz, appeared in the glass ceramic material, and the crystal size is significantly larger. Although the crystallinity is improved, the transmittance degenerated significantly, which even renders the refractivity cannot be determined. Such glass ceramics cannot meet the requirements as cover materials.

The glass precursor prepared by the proportion scheme in Scheme 8 was subjected to microcrystallization at different heating rates for crystallization (5° C./min, 20° C./min, 30° C./min). The photos of the prepared glass ceramics are shown in FIG. 5, the XRD patterns of the prepared glass ceramics are shown in FIG. 4, and the transmittance of the prepared glass ceramics for 550 nm wavelength light are shown in FIG. 6. Referring to FIGS. 4 to 6, it can be seen that, when the heating rate during crystallization is within the range of 0 to 20° C./min, impurity crystals were precipitated in the glass (there are obvious excess characteristic peaks on the XRD patterns), resulting in haze and even devitrification of the glass ceramic. When the crystallization is carried out at a heating rate of 30° C./min, no impurity crystal was precipitated and the glass remains transparent.

According to the invention, compositions of the spinel glass ceramic material are optimized by introducing into the spinel glass ceramic more Li ions and Na ions used for chemical strengthening via ion exchange, such that the spinel glass ceramic without an impurity crystal phase (e.g., Li-containing crystal phase, quartz, solid solution of quartz and other impurity crystal phases) is obtained, which does not exhibit phenomena including haze, devitrification and the like, ensuring that the glass ceramic material has an excellent transmittance.

By introducing more Li ions and Na ions into the spinel glass ceramic, the prepared spinel glass ceramic can be chemically strengthened to obtain the transparent strengthened glass ceramic having high CS, DOL_0, CT_AV and CT_LD, and the strengthened glass ceramic shows excellent drop resistance performance.

After the performance test of the glass ceramic prepared by the invention, it is found that the transparent spinel glass ceramic material of the present invention has a high crystallinity, which brings excellent mechanical properties to the glass ceramic material.

The present invention also provides a preparation method of the spinel glass ceramic. By controlling the process parameters of the crystallization process and the nucleation process and setting the parameter requirements of the heating rates, the spinel glass ceramic without an impurity crystal phase (such as Li-containing crystal phase, quartz, solid solution of quartz and other impurity crystal phases) are finally obtained, and excellent optical properties of the glass ceramic material are achieved.

Finally, it should be noted that the above examples are only used to illustrate the technical solutions of the present application and not to limit the scope thereof. Those skilled in the art should understand that any modifications or equivalent substitutions made within the spirit and principle of the present application should be included in the protection scope of the present application.

We claim:

1. A transparent strengthened glass ceramic having high stress depth, wherein, a crystal phase of the strengthened glass ceramic comprises spinel crystal and zirconium oxide crystal, and does not comprise a Li-containing crystal; and the strengthened glass ceramic has a compressive stress zone extending from a surface of the strengthened glass ceramic to a compressive depth, the depth of compressive stress layer DOL_0 of the strengthened glass ceramic is greater than or equal to 14% of the thickness of the strengthened glass ceramic, and the linear density of center tension CT_LD of the strengthened glass ceramic is 25,000 to 40.000 MPa/mm;

the strengthened glass ceramic comprises a compressive stress layer on the surface and a tensile stress layer inside, and in molar percentage of oxides, the tensile stress layer of the strengthened glass ceramic comprises:

$Li_2O$: 3.50 to 6.00 mol %, $Na_2O$: 2.00 to 4.00 mol %, $SiO_2$: 50.00 to 65.00 mol %, $Al_2O_3$: 14.50 to 25.00 mol %, MgO: 3.50 to 8.00 mol %, ZnO: 8.00 to 16.00 mol %, BaO: 0 to 2.00 mol %, and $TiO_2+ZrO_2$: 3.00 to 5.50 mol %; and in molar percentage of oxides, the tensile stress layer of the strengthened glass ceramic satisfies:

$$0.40 \le (Al_2O_3 + ZnO + MgO + ZrO_2 + TiO_2)/(Li_2O+Na_2O+SiO_2+BaO) \le 0.70.$$

2. The transparent strengthened glass ceramic having high stress depth according to claim 1, wherein, the crystal phase of the strengthened glass ceramic does not comprise quartz and a solid solution of quartz.

3. The transparent strengthened glass ceramic having high stress depth according to claim 1, wherein, the surface compressive stress CS of the strengthened glass ceramic is greater than or equal to 650 MPa.

4. The transparent strengthened glass ceramic having high stress depth according to claim 1, wherein, the average center tension CT_AV of the strengthened glass ceramic is greater than or equal to 35.0 MPa.

5. The transparent strengthened glass ceramic having high stress depth according to claim 1, wherein, the Vickers hardness of the strengthened glass ceramic is greater than or equal to 740HV0.3.

6. The transparent strengthened glass ceramic having high stress depth according to claim 1, wherein, the fracture toughness of the strengthened glass ceramic is greater than or equal to 1.500 MPa·m$^{1/2}$.

7. The transparent strengthened glass ceramic having high stress depth according to claim 1, wherein, the spinel crystal comprises a zinc spinel and a magnesium spinel.

8. The transparent strengthened glass ceramic having high stress depth according to claim 1, wherein, the transmittance of the strengthened glass ceramic with a thickness of 0.7 mm is greater than 85.00% at a light having a wavelength of 550 nm.

9. The transparent strengthened glass ceramic having high stress depth according to claim 1, wherein, the strengthened glass ceramic has a crystallinity of at least 30.00 wt. %; and/or wherein, the average crystal size in the strengthened glass ceramic is less than or equal to 15.0 nm.

10. The transparent strengthened glass ceramic having high stress depth according to claim 1, wherein, the transparent strengthened glass ceramic having high stress depth is prepared by a method comprising:

(1) batching and mixing raw materials to prepare a glass precursor;

(2) subjecting the prepared glass precursor to nucleation and crystallization successively to prepare a transparent spinel glass ceramic; and (3) subjecting the transparent spinel glass ceramic obtained in step (2) to a one-step or multi-step ion exchange process in a salt bath to obtain the strengthened glass ceramic;

in step (2), during the crystallization, the temperature is raised at a heating rate of greater than 20° C./min to reach the crystallization temperature.

11. The transparent strengthened glass ceramic having high stress depth according to claim 10, wherein, in step (2), the nucleation is performed at a nucleation temperature of 700 to 800° C. for a nucleation time of 30 to 1440 min; and the crystallization is performed at a crystallization temperature of 900 to 1000° C. for a crystallization time of 5 to 1440 min.

12. The transparent strengthened glass ceramic having high stress depth according to claim 11, wherein, in step (2), during the nucleation, the temperature is raised at a heating rate of 5 to 20° C./min to reach the nucleation temperature.

13. The transparent strengthened glass ceramic having high stress depth according to claim 10, wherein, in step (3), during the one-step ion exchange, the salt bath comprises 50 to 100 wt. % NaNO$_3$+0 to 50 wt. % KNO$_3$, and the ion exchange is performed at a temperature of 400 to 500° C. for a time period of 0.5 to 48 hours; or in step (3), during a two-step ion exchange:

in the first step, the salt bath comprises 90 to 100 wt. % NaNO$_3$+0 to 10 wt. % KNO$_3$, and the ion exchange is performed at a temperature of 400 to 500° C. for a time period of 0.5 to 48 hours; and in the second step, the salt bath comprises 0 to 10 wt. % NaNO$_3$+90 to 100 wt. % KNO$_3$, and the ion exchange is performed at a temperature of 400 to 500° C. for a time period of 0.5 to 48 hours.

14. The transparent strengthened glass ceramic having high stress depth according to claim 1, wherein the transparent strengthened glass ceramic having high stress depth is used in watches, transparent armors, guided missile windows, fairings, substrate materials, new lamps and lanterns, observation windows for equipment used in high-temperature, high-pressure and corrosive environments, automobiles, trains, aircrafts, marine vehicles, building materials, or portable intelligent electronic devices.

15. The transparent strengthened glass ceramic having high stress depth according to claim 1, wherein the transparent strengthened glass ceramic having high stress depth is comprised in an electronic terminal, and wherein the electronic terminal comprises:

a housing, comprising a front surface, a back surface, and a side surface; and an electronic assembly partially located in the housing, comprising a display device located on or adjacent to the front surface of the housing; wherein the front surface and/or the back surface and/or the side surface comprises the strengthened glass ceramic material; and a covering product configured to cover the front surface of the housing or dispose on the display device, wherein the covering product comprises the strengthened glass ceramic material; and wherein the electronic terminal includes mobile phones, tablet computers, or photovoltaic devices.

16. The transparent strengthened glass ceramic having high stress depth according to claim 1, wherein, in molar percentage of oxides, the tensile stress layer of the strengthened glass ceramic satisfies:

$$0.035 \le Na_2O/(Li_2O+Na_2O+SiO_2+BaO) \le 0.070;$$

and/or $0.054 \le Li_2O/(Li_2O+Na_2O+SiO_2+BaO) \le 0.090;$ and/or $0.43 \le$ $(Al_2O_3+ZnO+MgO+ZrO_2+TiO_2)/(Li_2O+Na_2O+SiO_2+BaO) \le 0.68.$

17. The transparent strengthened glass ceramic having high stress depth according to claim 1, wherein, in molar percentage of oxides, the tensile stress layer of the strengthened glass ceramic comprises:

SiO$_2$: 50.00 to 63.00 mol %, and/or

Al$_2$O$_3$: 14.50 to 20.00 mol %, and/or

MgO: 3.90 to 7.60 mol %, and/or

ZnO: 8.00 to 15.50 mol %, and/or

BaO: 0 to 1.50 mol %, and/or

LizO: 3.50 to 5.00 mol %, and/or

Na$_2$O: 2.30 to 3.60 mol %, and/or

TiO$_2$: 0 to 2.00 mol %, and/or

ZrO$_2$: 2.50 to 5.00 mol %.

18. The transparent strengthened glass ceramic having high stress depth according to claim 1, wherein, in molar percentage of oxides, the tensile stress layer of the strengthened glass ceramic comprises:

SiO$_2$: 50.00 to 57.00 mol %, and/or

Al$_2$O$_3$: 15.00 to 19.00 mol %, and/or

MgO: 4.00 to 7.50 mol %, and/or

ZnO: 9.00 to 15.20 mol %, and/or

BaO: 1.00 to 1.35 mol %, and/or

Li$_2$O: 4.00 to 5.00 mol %, and/or

Na$_2$O: 3.00 to 3.60 mol %, and/or

TiO$_2$: 0.30 to 1.30 mol %, and/or

ZrO$_2$: 2.90 to 4.20 mol %.

19. The transparent strengthened glass ceramic having high stress depth according to claim 1, wherein, the linear density of center tension CT_LD of the strengthened glass ceramic is 27,000 to 40,000 MPa/mm; and/or the surface compressive stress CS of the strengthened glass ceramic is 650 to 1000 MPa; and/or the average center tension CT_AV of the strengthened glass ceramic is 35.0 to 70.0 MPa; and/or the fracture toughness of the strengthened glass ceramic is 1.500 to 1.7000 MPa·m$^{1/2}$.

20. The transparent strengthened glass ceramic having high stress depth according to claim 1, wherein, the strengthened glass ceramic has a crystallinity of 30.00 to 50.00 wt. %; and/or the average crystal size in the strengthened glass ceramic is 3.0 to 15.0 nm.

* * * * *